United States Patent
Bairo

(10) Patent No.: US 10,861,847 B2
(45) Date of Patent: Dec. 8, 2020

(54) SEMICONDUCTOR DEVICE AND PROTECTION ELEMENT

(71) Applicant: SONY SEMICONDUCTOR SOLUTIONS CORPORATION, Kanagawa (JP)

(72) Inventor: Masaaki Bairo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/462,366

(22) PCT Filed: Nov. 30, 2017

(86) PCT No.: PCT/JP2017/043160
§ 371 (c)(1),
(2) Date: May 20, 2019

(87) PCT Pub. No.: WO2018/110304
PCT Pub. Date: Jun. 21, 2018

(65) Prior Publication Data
US 2019/0341380 A1    Nov. 7, 2019

(30) Foreign Application Priority Data
Dec. 14, 2016  (JP) .................. 2016-242146

(51) Int. Cl.
*H01L 27/02* (2006.01)
*H01L 27/12* (2006.01)

(52) U.S. Cl.
CPC ...... *H01L 27/0296* (2013.01); *H01L 27/0255* (2013.01); *H01L 27/0292* (2013.01); *H01L 27/1207* (2013.01)

(58) Field of Classification Search
CPC ............. H01L 27/0296; H01L 27/0255; H01L 27/0292; H01L 27/1207
(Continued)

(56) References Cited

U.S. PATENT DOCUMENTS

| 5,567,968 A | 10/1996 | Tsuruta et al. |
| 5,736,769 A | 4/1998 | Nishiura et al. |

(Continued)

FOREIGN PATENT DOCUMENTS

| EP | 0744770 A2 | 11/1996 |
| JP | 61-100954 A | 5/1986 |

(Continued)

OTHER PUBLICATIONS

International Search Report and Written Opinion of PCT Application No. PCT/JP2017/043160, dated Feb. 6, 2018, 11 pages of ISRWO.

*Primary Examiner* — Tong-Ho Kim
(74) *Attorney, Agent, or Firm* — Chip Law Group

(57) ABSTRACT

Provided is a semiconductor device and a protection element capable of suppressing electrical damage to a MOSFET or the like in a semiconductor substrate. A semiconductor device according to a first aspect of the present technology includes a MOSFET as a protected element formed on a semiconductor substrate and a protection element that suppresses electrical damage to the protected element formed on the semiconductor substrate, in which the protection element includes the semiconductor substrate, one or more layers of well regions formed on the semiconductor substrate, and a diffusion layer formed on the well region. The present technology can be applied to a CMOS image sensor, for example.

15 Claims, 31 Drawing Sheets

(58) Field of Classification Search
USPC .......................................................... 257/350
See application file for complete search history.

(56) References Cited

U.S. PATENT DOCUMENTS 5,923,067 A * 7/1999 Voldman ............. H01L 27/0255
257/349
2005/0233517 A1   10/2005   Aizawa et al.

FOREIGN PATENT DOCUMENTS

| JP | 63-228667 A | | 9/1988 |
| JP | 63228667 A | * | 9/1988 |
| JP | 04-280670 A | | 10/1992 |
| JP | 07-312424 A | | 11/1995 |
| JP | 08-316471 A | | 11/1996 |
| JP | 2005-294581 A | | 10/2005 |
| JP | 2005-347539 A | | 12/2005 |
| JP | 2016-009825 A | | 1/2016 |

* cited by examiner

SEMICONDUCTOR DEVICE AND PROTECTION ELEMENT

CROSS REFERENCE TO RELATED APPLICATIONS

This application is a U.S. National Phase of International Patent Application No. PCT/JP2017/043160 filed on Nov. 30, 2017, which claims priority benefit of Japanese Patent Application No. JP 2016-242146 filed in the Japan Patent Office on Dec. 14, 2016. Each of the above-referenced applications is hereby incorporated herein by reference in its entirety.

TECHNICAL FIELD

The present technology relates to a semiconductor device and a protection element, and more particularly to a semiconductor device and a protection element capable of suppressing electrical damage that can occur in a metal-oxide-semiconductor field-effect transistor (MOSFET) formed on a substrate.

BACKGROUND ART

In accordance with the progress of multi-functionalization of semiconductor devices in recent years, there is a trend of adopting a multilayer wiring structure including alternate stacked layers of a metal film and an insulating film. In order to form the multilayer wiring structure, it is necessary to repeatedly perform processes such as plasma chemical vapor deposition (CVD) and reactive ion etching (RIE) on a semiconductor substrate on which the MOSFET is formed.

These processes include deposition and etching using electrical polarity, and thus might cause the metal film to be charged during the process and then cause an excessive electric field to be applied to a gate insulating film of the MOSFET connected to the charged metal film. This leads to breakage of the gate insulating film of the MOSFET (hereinafter referred to as plasma damage).

Even in a case where human static electricity (electro static discharge (ESD)) is applied to the fabricated semiconductor device, for example, the gate insulating film of the MOSFET can also be destroyed (hereinafter referred to as electrostatic damage).

Against this, there are known methods for forming a protection diode as a protection element for protecting the MOSFET from such plasma damage or electrostatic damage (for example, refer to Patent Document 1). The protection diode is formed between a gate electrode of the MOSFET and the substrate such that reverse bias is generated when a gate voltage is applied. Accordingly, the protection diode makes it possible to suppress application of a voltage of the reverse withstand voltage or more to the gate electrode of the MOSFET.

Furthermore, in the CMOS process, the MOSFET is sometimes formed on a silicon-on-insulator (SOI) substrate in which a channel region of the MOSFET and the substrate are isolated from each other by an insulating film. In this case, since a buried oxide film (hereinafter also referred to as buried oxide (BOX) layer) formed as an insulating film on the SOI substrate is very thin (for example, 10 nm to 300 nm), the BOX layer also would undergo plasma damage or electrostatic damage in some cases.

To prevent this, there has been proposed a structure of a protection diode as a protection element for protecting the MOSFET and the BOX layer in the SOI substrate from plasma damage and electrostatic damage (refer to Patent Document 2, for example).

Here, plasma damage and electrostatic damage that can occur in MOSFET and BOX layer will be described in detail.

FIG. 1 is a cross-sectional view illustrating an example of a configuration of a known semiconductor device in which an N-type MOSFET is formed on an SOI substrate including a BOX layer.

In the semiconductor device illustrated in FIG. 1 includes a P-type well region (PW) 11 formed on a P-type semiconductor substrate (PSUB) 10 including Si, and an N-type MOSFET 14 is formed on the P-type well region 11, via a BOX layer 13.

Protection diodes 21, 22, and 23 are formed as protection elements between the wirings respectively connected to the drain, source, and gate of the N-type MOSFET 14 and the P-type well region 11. The protection diodes 21 to 23 are PN diodes each including an N-type diffusion layer (N+) 12 and a P-type well region 11.

CITATION LIST

Patent Document

Patent Document 1: Japanese Patent Application Laid-Open No. 2016-009825
Patent Document 2: Japanese Patent Application Laid-Open No. 2005-347539

SUMMARY OF THE INVENTION

Problems to be Solved by the Invention

FIG. 2 illustrates a current (IF)-voltage (VF) characteristic of the protection diodes 21 to 23. The horizontal axis of the figure illustrates a voltage of the N-type diffusion layer 12 in a case where the P-type well region 11 included in the PN diode is set to 0V. FIG. 3 illustrates a Vg-Id characteristic of the N-type MOSFET 14.

The characteristic illustrated in FIG. 2 indicates that application of a forward voltage of −0.7V or more causes a forward current to flow. In the case of the configuration illustrated in FIG. 1, however, the voltage that can be applied to the P-type well region 11 would be limited in accordance with the voltage applied to the drain, the source, and the gate of the N-type MOSFET 14. For example, in a case where 0V is applied to the gate while 1V is applied to the P-type well region 11, the protection diode 23 is forward biased, allowing the current to flow from the P-type well region 11 toward the gate corresponding to the applied voltage.

Furthermore, since the N-type MOSFET 14 has a Vg-Id characteristic illustrated in FIG. 3, in order to turn off the operation state of the N-type MOSFET 14 in a case where the P-type well region 11 is fixed to 0V, it is necessary to apply a voltage of −1V or below to the gate to achieve a biased state. In this case, the protection diode 23 is forward biased similarly to the above, allowing a current corresponding to the potential difference to flow from the P-type well region 11 toward the gate. Hereinafter, this problem will be referred to as a first problem.

Such excessive current would hinder the acquisition of desired circuit characteristics for the SOI-CMOS-LSI which uses a substrate bias effect technology to reduce the power consumption of an integrated circuit. Furthermore, in evaluation of current-voltage characteristics of the MOSFET, occurrence of such excessive current would hinder accurate evaluation of electrical characteristics of the device.

FIG. 4 is a view illustrating further problems that would be caused by the configuration illustrated in FIG. 1.

As illustrated in the drawing, the N-type MOSFET 14 is formed in a state where a channel region 33 and the substrate are completely isolated from each other by the insulating film (BOX layer 13). Accordingly, when a plasma process induces a charge to wiring 41 including a metal film connected to the gate, for example, the charge has no escape path other than the protection diodes 21 to 23. Therefore, an occurrence of a difference in the withstand voltage characteristics of the protection diodes 21 to 23 might lead to degradation of the reliability of the gate insulating film 34. Hereinafter, this problem will be referred to as a second problem.

For example, it is desirable that all the charges induced in the wiring 41 connected to the gate can escape from the protection diode 23 to the substrate side through a path 1. However, in a case where the reverse withstand voltage characteristic of the protection diode 22 is greatly reduced as compared with the reverse withstand voltage characteristic of the protection diode 23 for some reason, the charge induced in the wiring 41 connected to the gate would escape, with higher probability, to the substrate side via a path 2 having a lower withstand voltage. This would cause damage on the gate insulating film 34 of the N-type MOSFET 14, leading to higher failure probability of the semiconductor device.

In order to suppress the occurrence of such a situation, it is preferable that the protection diodes 21 to 23 connected to the gate, the source, and the drain have withstand voltage characteristics having equal strength and sufficient magnitude for the positive and negative drive voltage ranges.

Note that a similar problem can occur in a semiconductor device including a P-type MOSFET having driving voltage polarity opposite to the polarity of the N-type MOSFET 14 of the semiconductor device illustrated in FIG. 1, that is, in a known semiconductor device including a P-type MOSFET 51 on a SOI substrate as illustrated in FIG. 5.

In this case, however, it is necessary to add alteration to a diffusion layer 52 and a well region 53 involving the polarity of the protection diode, in accordance with the polarity of the MOSFET.

Therefore, for example, designing the semiconductor device circuit with wrong polarities on the MOSFET and on the protection diode would cause a great current to flow in the protection diode in the driving state of the MOSFET. This would result in an operation failure on the semiconductor device in the worst case.

The present technology has been made in view of such a situation, and is intended to suppress electrical damage to a MOSFET or the like in a semiconductor substrate.

Solutions to Problems

A semiconductor device according to a first aspect of the present technology includes: a MOSFET as a protected element formed on a semiconductor substrate; and a protection element that suppresses electrical damage to the protected element formed on the semiconductor substrate, in which the protection element includes: the semiconductor substrate; one or more layers of well regions formed on the semiconductor substrate; and a diffusion layer formed on the well region.

The protection element can include: the semiconductor substrate; the well region having a conductivity type opposite to the type of the semiconductor substrate; and the diffusion layer having the same conductivity type as the type of the semiconductor substrate.

The well region can be set in a floating state.

The protection element can include: a first protection element connected to a drain layer of the MOSFET; a second protection element connected to a gate electrode of the MOSFET; and a third protection element connected to a source layer of the MOSFET, in which the diffusion layer included in each of the first to third protection elements can be isolated from each other.

The well region included in the second protection element can be unified together with at least one of the well region included in the first protection element or the well region included in the third protection element, as a shared well region.

The well regions individually included in the first to third protection elements can be isolated from each other.

The first protection element or the third protection element out of the first to third protection elements can be omitted.

The protection element can include: the semiconductor substrate; a first well region formed on the semiconductor substrate and having a conductivity type opposite to the type of the semiconductor substrate; a second well region formed on the first well region and having a same conductivity type as the type of the semiconductor substrate; and the diffusion layer having the conductivity type opposite to the type of the semiconductor substrate.

The second well region can be set in a floating state.

The first well region can be set in a floating state.

The first well region can be set in a fixed potential state.

The protection element can include: a first protection element connected to a drain layer of the MOSFET; a second protection element connected to a gate electrode of the MOSFET; and a third protection element connected to a source layer of the MOSFET, in which the diffusion layer included in each of the first to third protection elements can be isolated from each other.

The second well region included in the second protection element can be unified together with at least one of the second well region included in the first protection element or the second well region included in the third protection element, as a shared well region.

The second well regions individually included in the first to third protection elements can be isolated from each other.

The first well regions individually included in the first to third protection elements can be unified as a shared well region.

The first well regions individually included in the first to third protection elements can be isolated from each other.

The first protection element or the third protection element out of the first to third protection elements can be omitted.

The semiconductor device according to the first aspect of the present technology can further include a buried insulating layer formed under the MOSFET.

A semiconductor device according to a second aspect of the present technology is a protection element that suppresses electrical damage to a protected element formed on a semiconductor substrate, the protection element including: the semiconductor substrate; the well region formed on the semiconductor substrate and having a conductivity type opposite to the type of the semiconductor substrate; and the diffusion layer formed on the well region and having the same conductivity type as the type of the semiconductor substrate.

A semiconductor device according to a third aspect of the present technology is a protection element that suppresses electrical damage to a protected element formed on a semiconductor substrate, the protection element including: the semiconductor substrate; a first well region formed on the semiconductor substrate and having a conductivity type opposite to the type of the semiconductor substrate; a second well region formed on the first well region and having the same conductivity type as the type of the semiconductor substrate; and the diffusion layer formed on the second well region and having the conductivity type opposite to the type of the semiconductor substrate.

Effects of the Invention

According to the first to third aspects of the present technology, it is possible to suppress electrical damage to the protected element formed on the semiconductor substrate.

MODE FOR CARRYING OUT THE INVENTION

Hereinafter, best modes (hereinafter referred to as embodiments) for implementing the present technology will be described in detail with reference to the drawings.

First Embodiment

Figure 6:
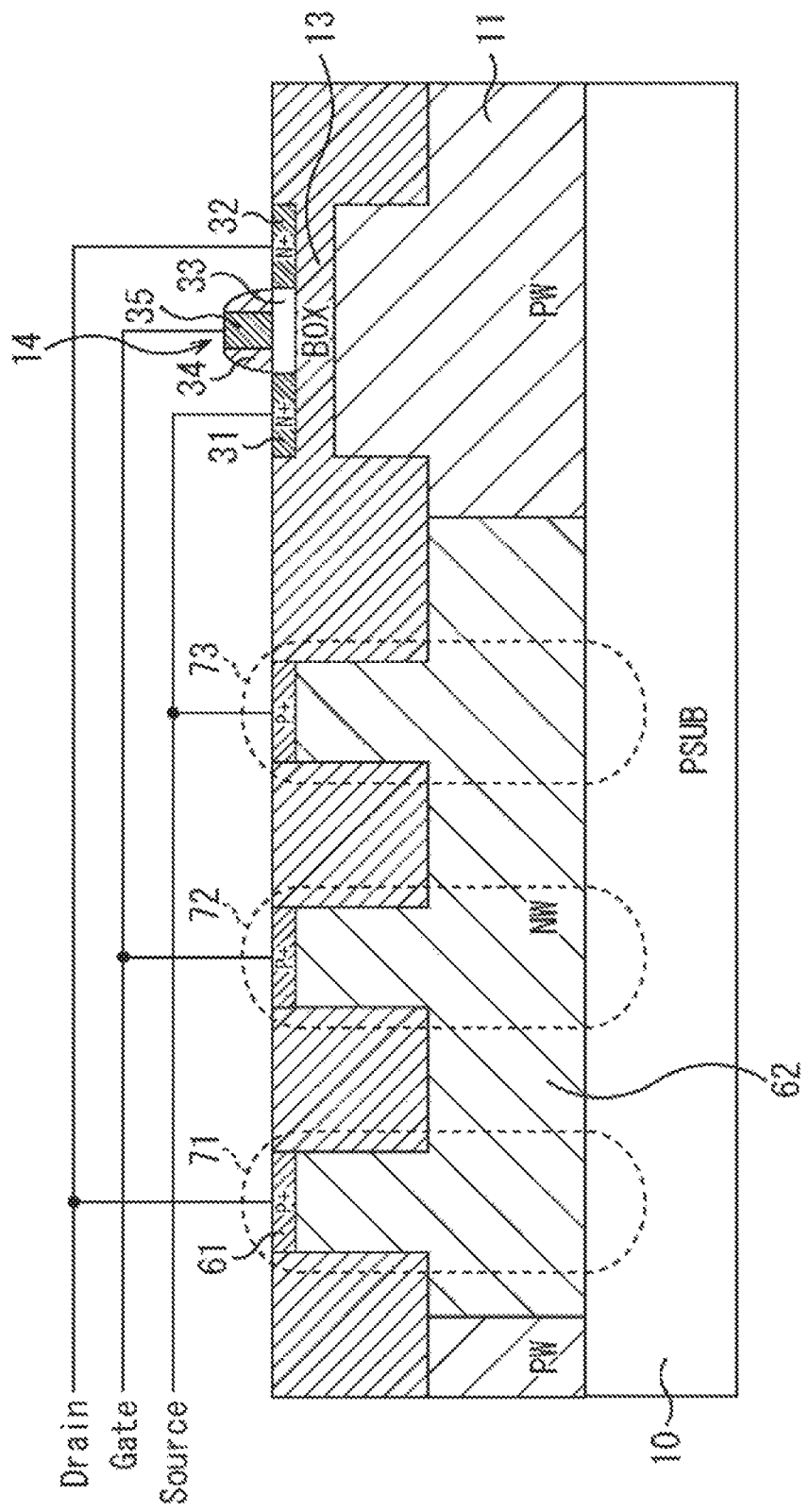
FIG. 6 is a cross-sectional view illustrating a first configuration example of a semiconductor device according to the present technology.

FIG. 6 is a cross-sectional view illustrating a configuration example (first configuration example) of a semiconductor device according to a first embodiment of the present technology.

The first configuration example includes: a P-type semiconductor substrate 10 including Si; a BOX layer 13 provided on a P-type well region 11 on the P-type semiconductor substrate 10; and an N-type MOSFET 14 formed on the BOX layer 13.

The N-type MOSFET 14 includes: a source layer 31 and a drain layer 32 both including an N-type diffusion layer (N+); and a channel layer 33 formed between the source layer 31 and the drain layer 32. On the channel layer 33, a gate electrode 35 is provided via a gate insulating film 34.

Over the source layer 31, the drain layer 32, and the gate electrode 35, there are provided a reside layer and a contact plug. The contact plug is electrically isolated via an interlayer insulating film. The contact plug is individually electrically connected to a wiring layer (not illustrated) including a metal film.

Protection elements 71, 72, and 73 are respectively connected to the drain layer 32, the gate electrode 35, and the source layer 31. Each of the protection elements 71 to 73 includes: a P-type diffusion layer (P+) 61 having the same conductivity type (in this case, P-type) as the type of the P-type semiconductor substrate 10; a floating-state N-type well region 62 having a conductivity type (in this case, N-type) opposite to the type of the P-type semiconductor substrate 10 and having potential unfixed; and the P-type semiconductor substrate 10.

The P-type diffusion layer 61 is formed in a surface region of the P-type semiconductor substrate 10. The N-type well region 62 is formed so as to surround the P-type diffusion layer 61. The N-type well regions 62 included in the protection elements 71 to 73 are unified as a shared well region.

Figure 7:
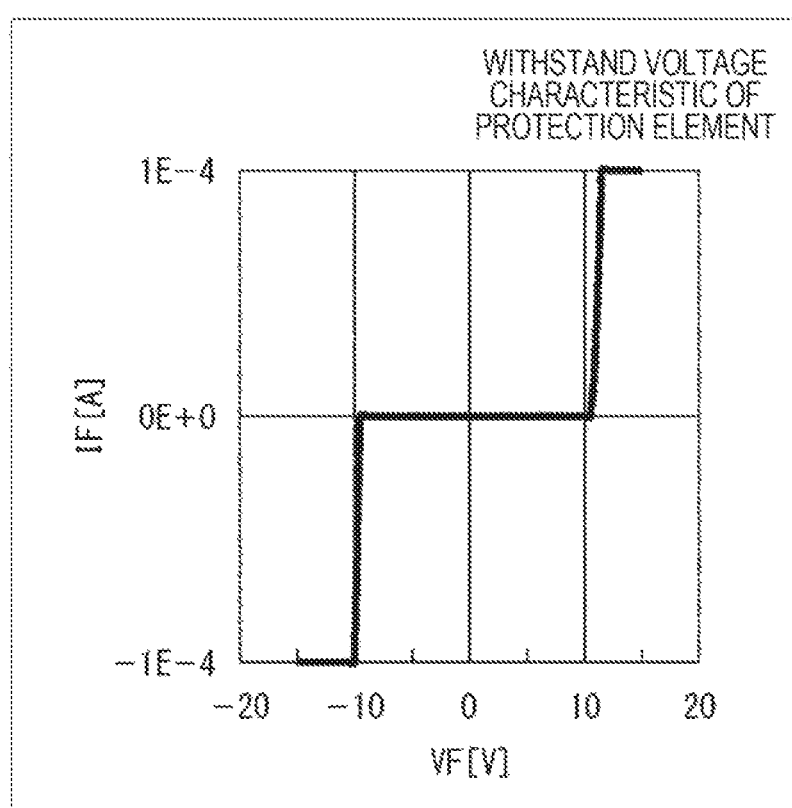
FIG. 7 is a graph illustrating a current-voltage characteristic of the protection element illustrated in FIG. 6.

FIG. 7 illustrates a current (IF)-voltage (VF) characteristic between the P-type diffusion layer 61 and the P-type semiconductor substrate 10 included in each of the protection elements 71 to 73.

As illustrated in the figure, the protection elements 71 to 73 have withstand voltage characteristics of 5V or more with respect to both the positive and negative potential differences. Therefore, in a case where an excessive voltage is applied to the N-type MOSFET 14 by plasma, static electricity, or the like, via wiring connected to the gate or the like to the semiconductor device during or after manufacture, the protection elements 71 to 73 would be destroyed prior to the gate insulating film 34 and the BOX layer 13. This makes it possible to discharge the charge from the wiring side to the P-type semiconductor substrate 10 via the destroyed protection elements 71 to 73. Accordingly, this makes it possible to protect the gate insulating film 34 and the BOX layer 13.

Figure 1:
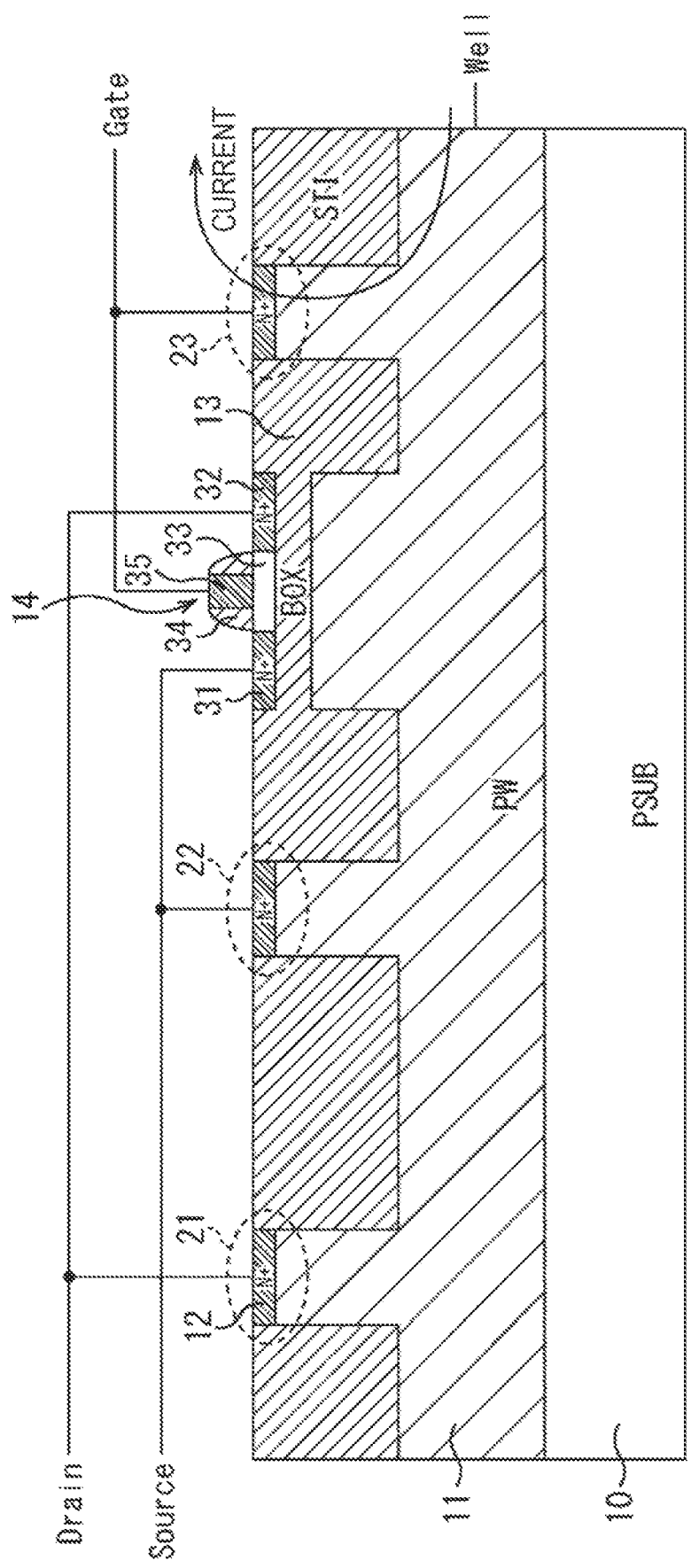
FIG. 1 is a cross-sectional view illustrating an example of a configuration of a known semiconductor device in which an N-type MOSFET is formed on an SOI substrate.
Figure 2:
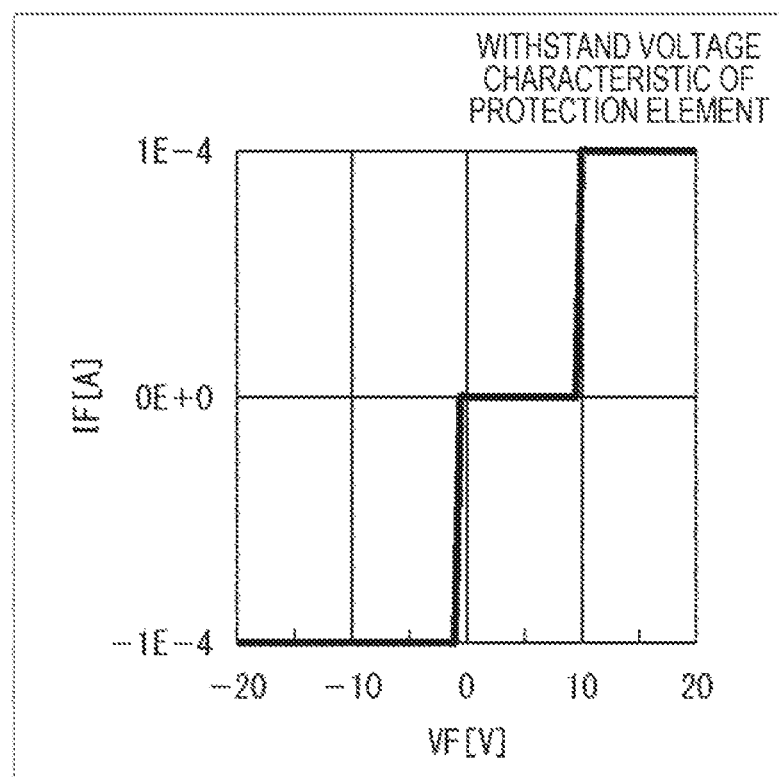
FIG. 2 is a graph illustrating a current-voltage characteristic of the protection element illustrated in FIG. 1.
Figure 3:
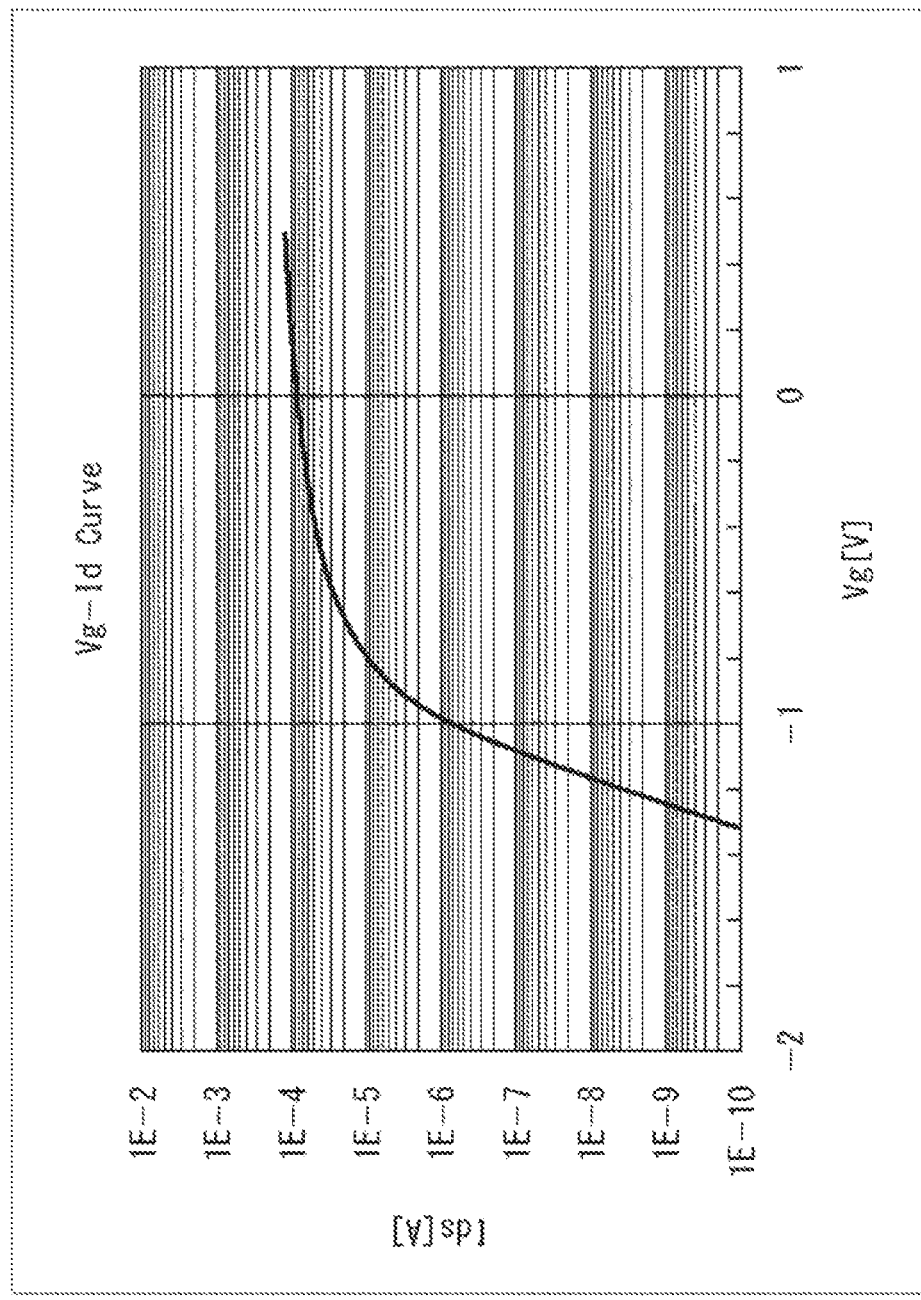
FIG. 3 is a graph illustrating a Vg-Id characteristic of the N-type MOSFET illustrated in FIG. 1.
Figure 4:
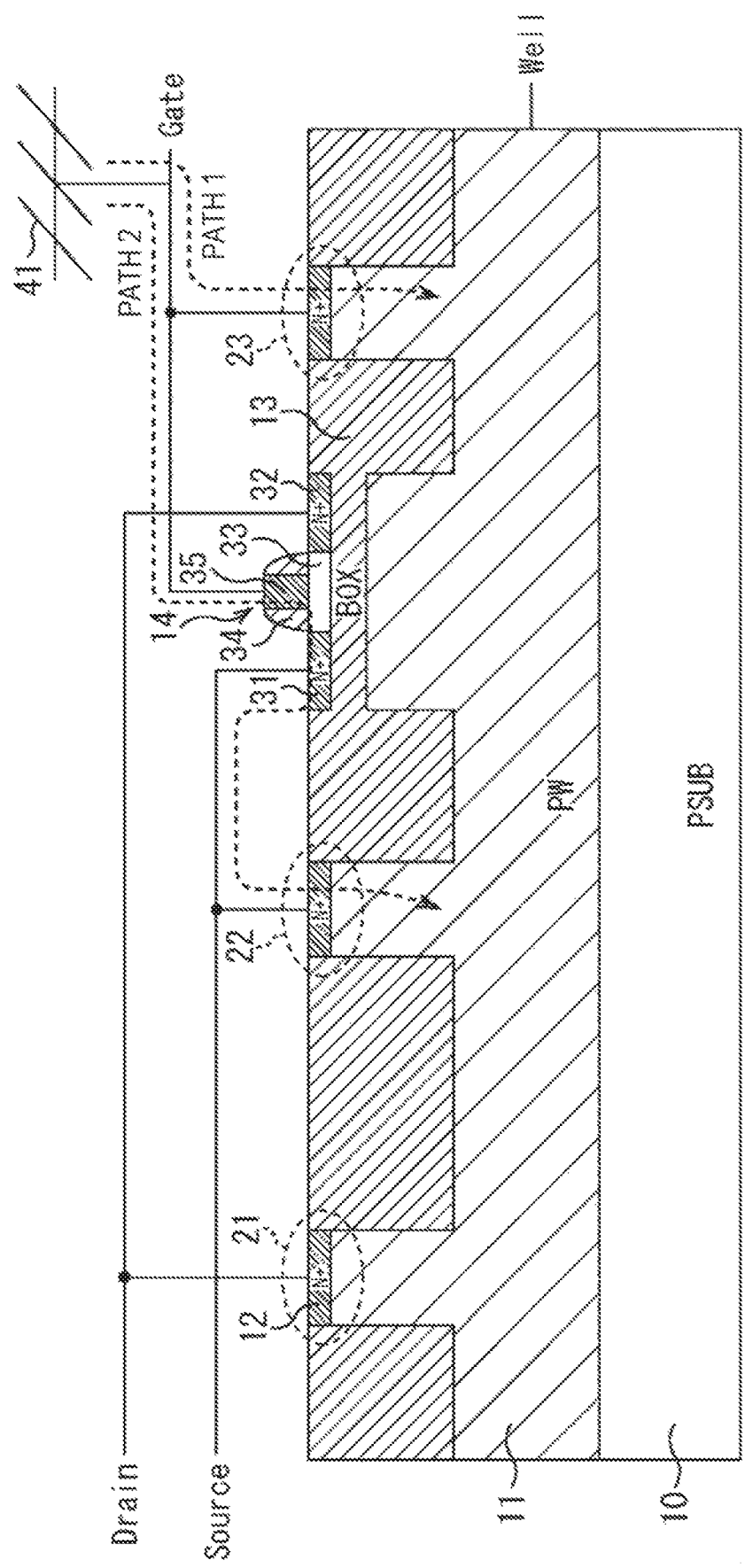
FIG. 4 is a view illustrating further problems that would be caused by the configuration illustrated in FIG. 1.
Figure 5:
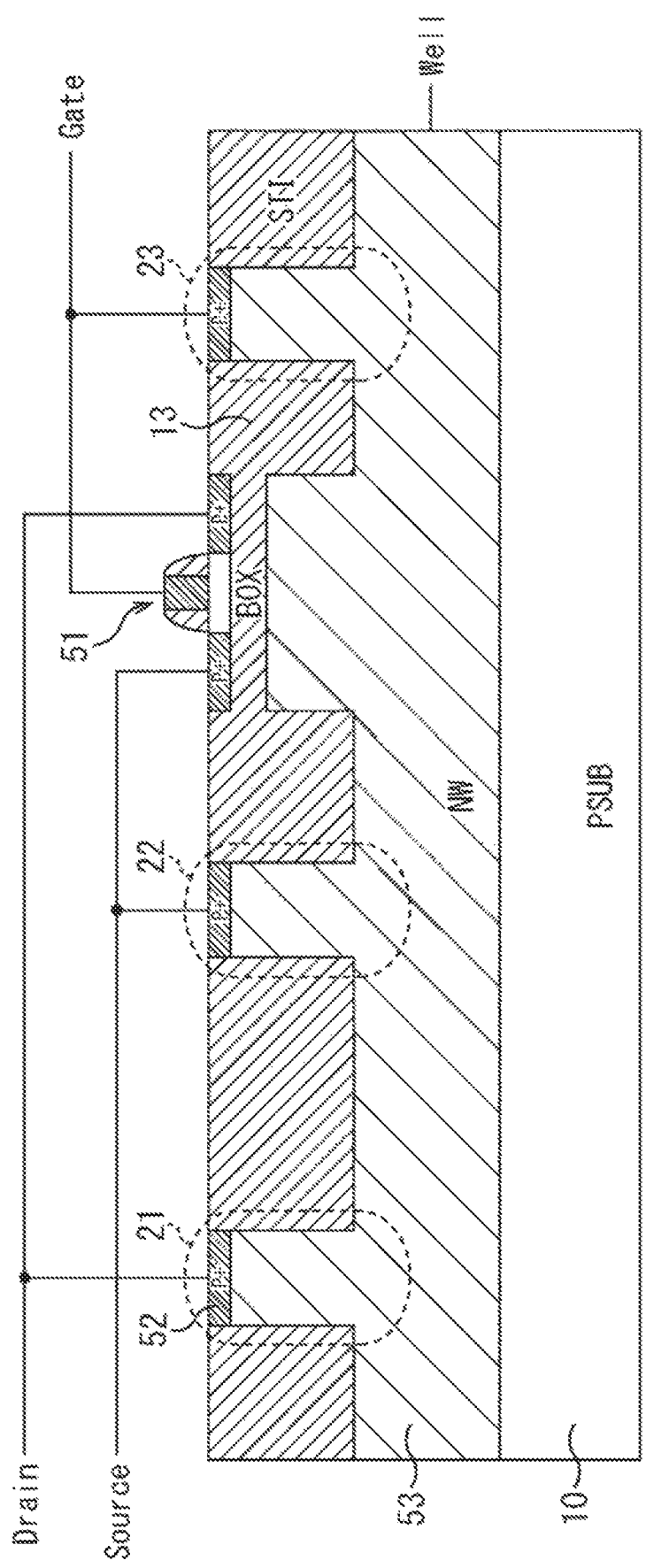
FIG. 5 is a cross-sectional view illustrating an example of a configuration of a known semiconductor device in which a P-type MOSFET is formed on an SOI substrate.

Furthermore, the protection elements 71 to 73 have withstand voltage characteristics of 5V or more with respect to both the positive and negative potential differences, making it possible to suppress the occurrence of the above-described first problem. That is, even when the P-type well region 11 is set to 0V and the gate electrode 35 is set to a negative bias of 1V or more, it is possible to suppress a large current flowing from the P-type well region 11 toward the gate. Accordingly, in comparison with the known configuration illustrated in FIG. 1, it is possible to greatly increase the range of applicable combinations of the potential of the P-type well region 11, the gate potential, the drain potential, and the source potential.

Furthermore, the N-type well regions 62 included in the protection elements 71 to 73 are unified as a shared well region. Accordingly, even if a potential fluctuation occurs in the N-type well region 62, for example, it is possible to suppress an occurrence of difference in the withstand voltage characteristic among the protection elements 71 to 73. This leads to suppression of the occurrence of the above-described second problem.

That is, in a case where a charge is induced by wiring connected to the gate due to some cause, it is possible to suppress the charge flow from the gate electrode 35 to the protection element 73 via the gate insulating film 34 and the source layer 31, or suppress the charge flow from the gate electrode 35 to the protection element 71 via the gate insulating film 34 and the drain layer 32. This makes it possible to reduce the probability of occurrence of damage to the gate insulating film 34, leading to improvement of the reliability of the semiconductor device.

First Modification of First Embodiment

Figure 8:
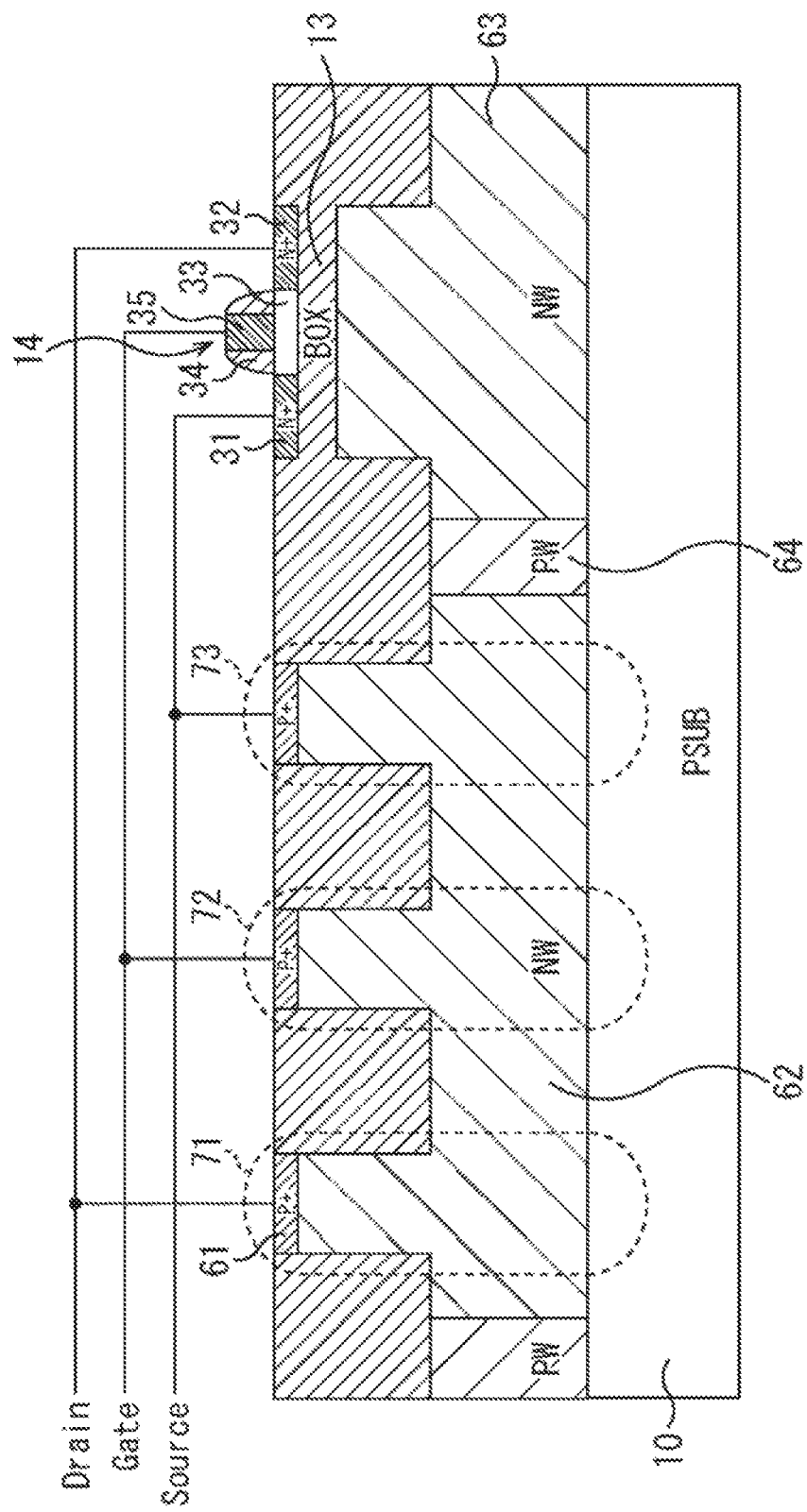
FIG. 8 is a cross-sectional view illustrating a first modification of the first configuration example illustrated in FIG. 6.

FIG. 8 illustrates a first modification of the first configuration example illustrated in FIG. 6. The first modification includes an N-type well region 63 replacing the N-type MOSFET 14 and the P-type well region 11 below the BOX layer 13 in the first configuration example illustrated in FIG. 6. Note that a P-type well region 64 is formed between the N-type well region 63 and the N-type well region 62 in order to electrically isolate these regions from each other.

This first modification also makes it possible to obtain operational effects similar to the first configuration example.

Second Modification of First Embodiment

Figure 9:
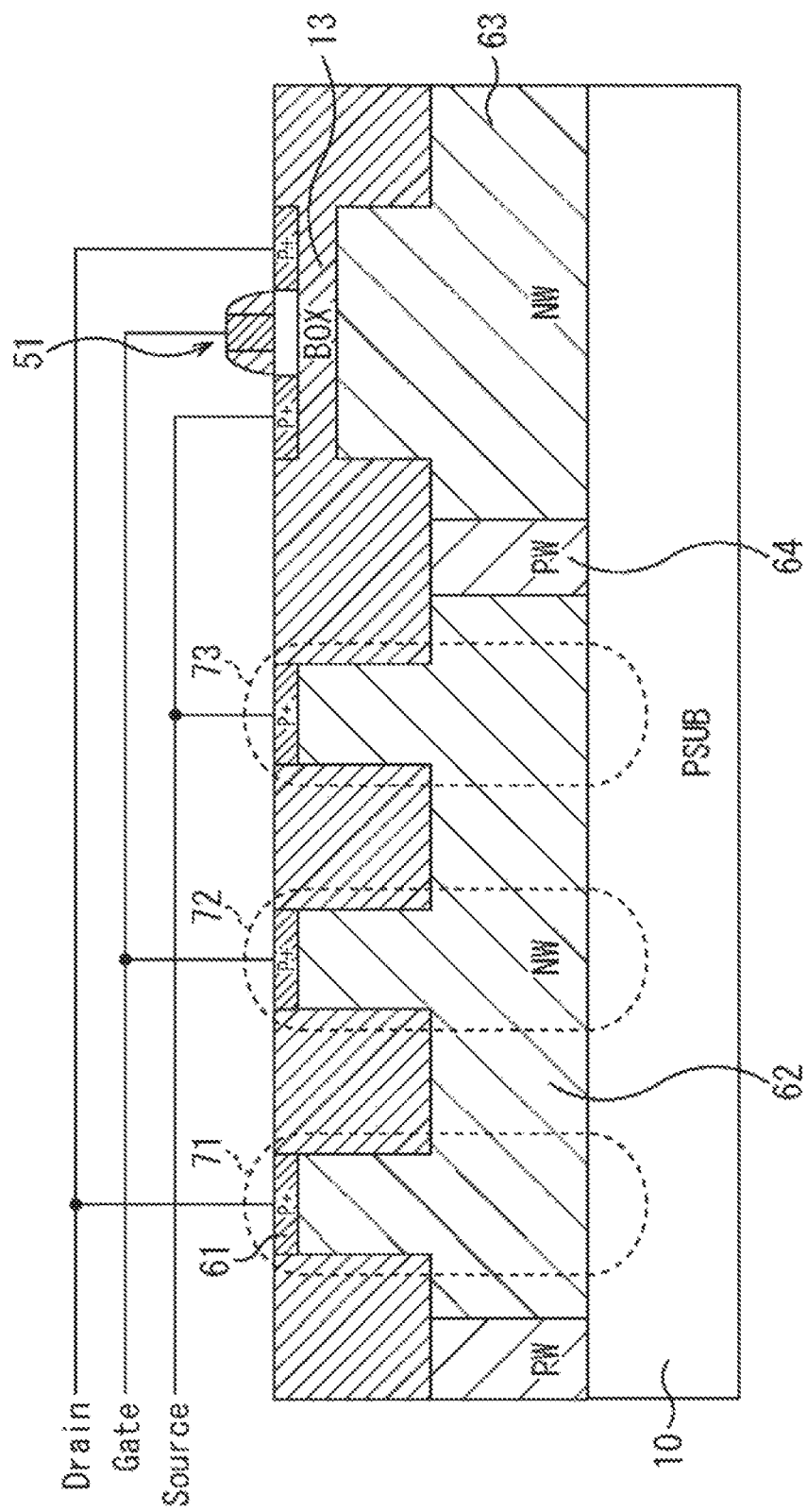
FIG. 9 is a cross-sectional view illustrating a second modification of the first configuration example illustrated in FIG. 6.

FIG. 9 illustrates a second modification of the first configuration example illustrated in FIG. 6. The second modification uses a P-type MOSFET 51 in place of the N-type MOSFET 14 in the second modification illustrated in FIG. 8, and thus, the other configuration is the same. That is, even when the polarity of the MOSFET is changed from N-type to P-type, the same elements are used as they are without changing the polarities of the protection elements 71 to 73.

This second modification also makes it possible to obtain operational effects similar to the first configuration example.

Third Modification of the First Embodiment

Figure 10:
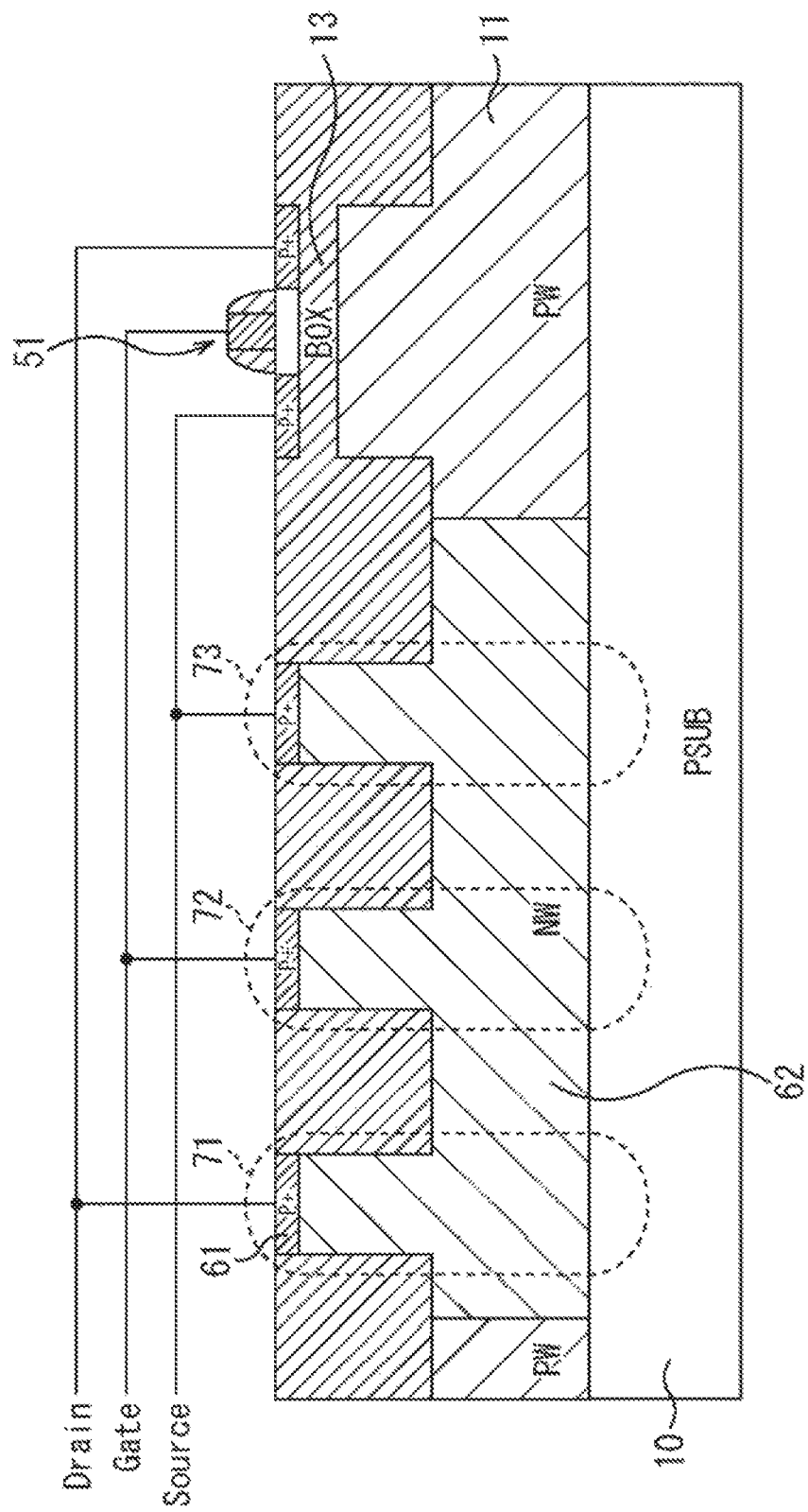
FIG. 10 is a cross-sectional view illustrating a third modification of the first configuration example illustrated in FIG. 6.

FIG. 10 illustrates a third modification of the first configuration example illustrated in FIG. 6. The third modification uses a P-type MOSFET 51 in place of the N-type MOSFET 14 in the first configuration example illustrated in FIG. 6, and thus, the other configuration is the same. That is, even when the polarity of the MOSFET is changed from N-type to P-type, the same elements are used as they are without changing the polarities of the protection elements 71 to 73.

This third modification also makes it possible to obtain operational effects similar to the first configuration example.

Fourth Modification of the First Embodiment

Figure 11:
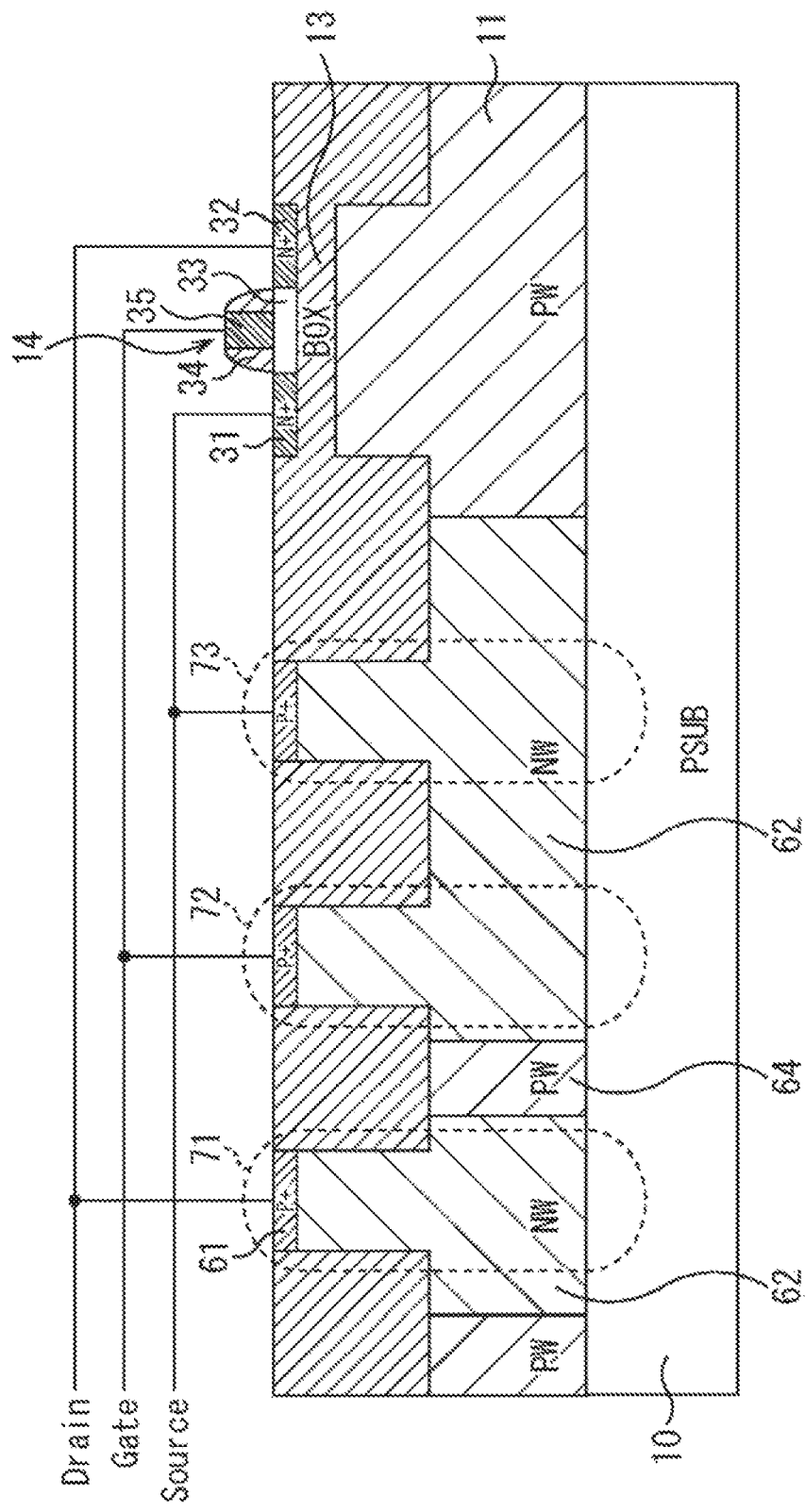
FIG. 11 is a cross-sectional view illustrating a fourth modification of the first configuration example illustrated in FIG. 6.

FIG. 11 illustrates a fourth modification of the first configuration example illustrated in FIG. 6. The first configuration example illustrated in FIG. 6 uses the unified N-type well region 62 as a shared well region included in the protection elements 71 to 73. In contrast, the fourth modification differs from the first configuration example in that the N-type well regions 62 included in the protection elements 72 and 73 are unified as a shared well region and that the protection elements 71 to 73 are isolated from each other by the N-type well region 62 included in the protection element 71 and the P-type well region 64.

This fourth modification also makes it possible to obtain operational effects similar to the first configuration example.

Fifth Modification of the First Embodiment

Figure 12:
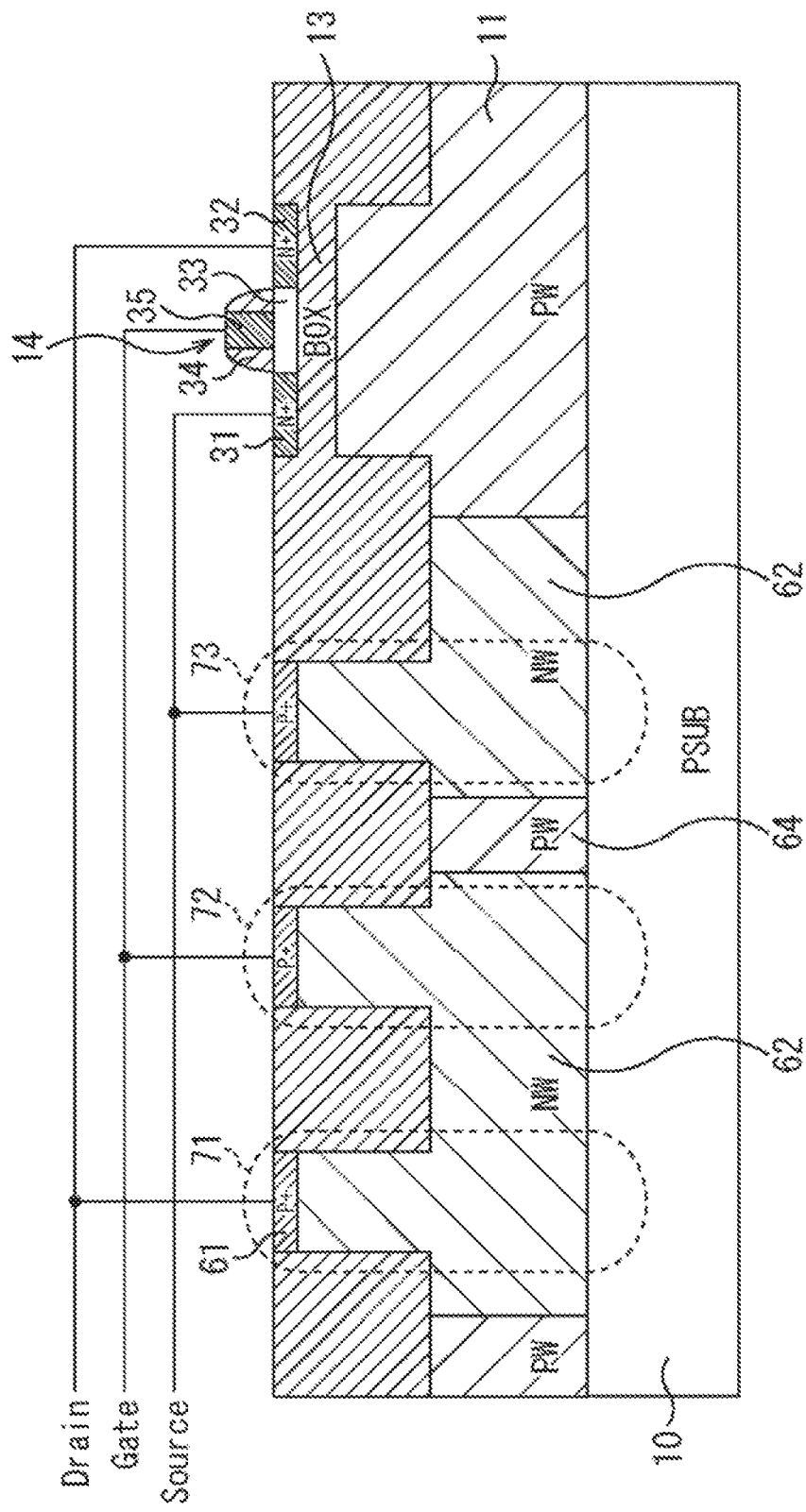
FIG. 12 is a cross-sectional view illustrating a fifth modification of the first configuration example illustrated in FIG. 6.

FIG. 12 illustrates a fifth modification of the first configuration example illustrated in FIG. 6. The first configuration example illustrated in FIG. 6 uses the unified N-type well region 62 as a shared well region included in the protection elements 71 to 73. In contrast, the fifth modification differs from the first configuration example in that the N-type well regions 62 included in the protection elements 71 and 72 are unified as a shared well region and that the protection elements 71 to 73 are isolated from each other by the N-type well region 62 included in the protection element 73 and the P-type well region 64.

This fifth modification also makes it possible to obtain operational effects similar to the first configuration example.

Sixth Modification of the First Embodiment

Figure 13:
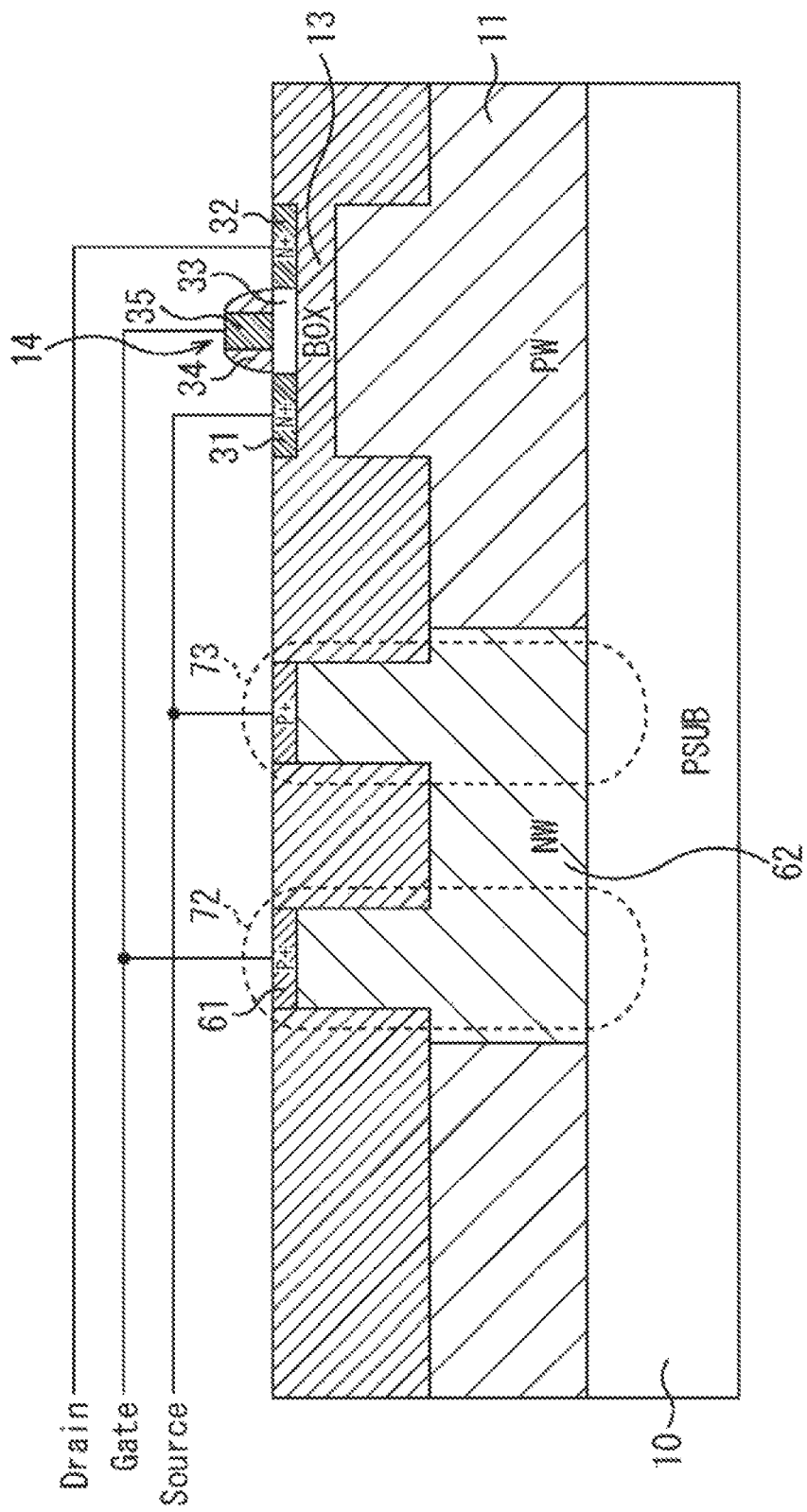
FIG. 13 is a cross-sectional view illustrating a sixth modification of the first configuration example illustrated in FIG. 6.

FIG. 13 illustrates a sixth modification of the first configuration example illustrated in FIG. 6. In the sixth modification, the protection element 71 is omitted from the first configuration example illustrated in FIG. 6. That is, the sixth modification forms the protection element 72 connected to the gate and the protection element 73 connected to the source by using the unified N-type well region 62 as a shared well region.

This sixth modification also makes it possible to obtain operational effects similar to the first configuration example.

Seventh Modification of the First Embodiment

Figure 14:
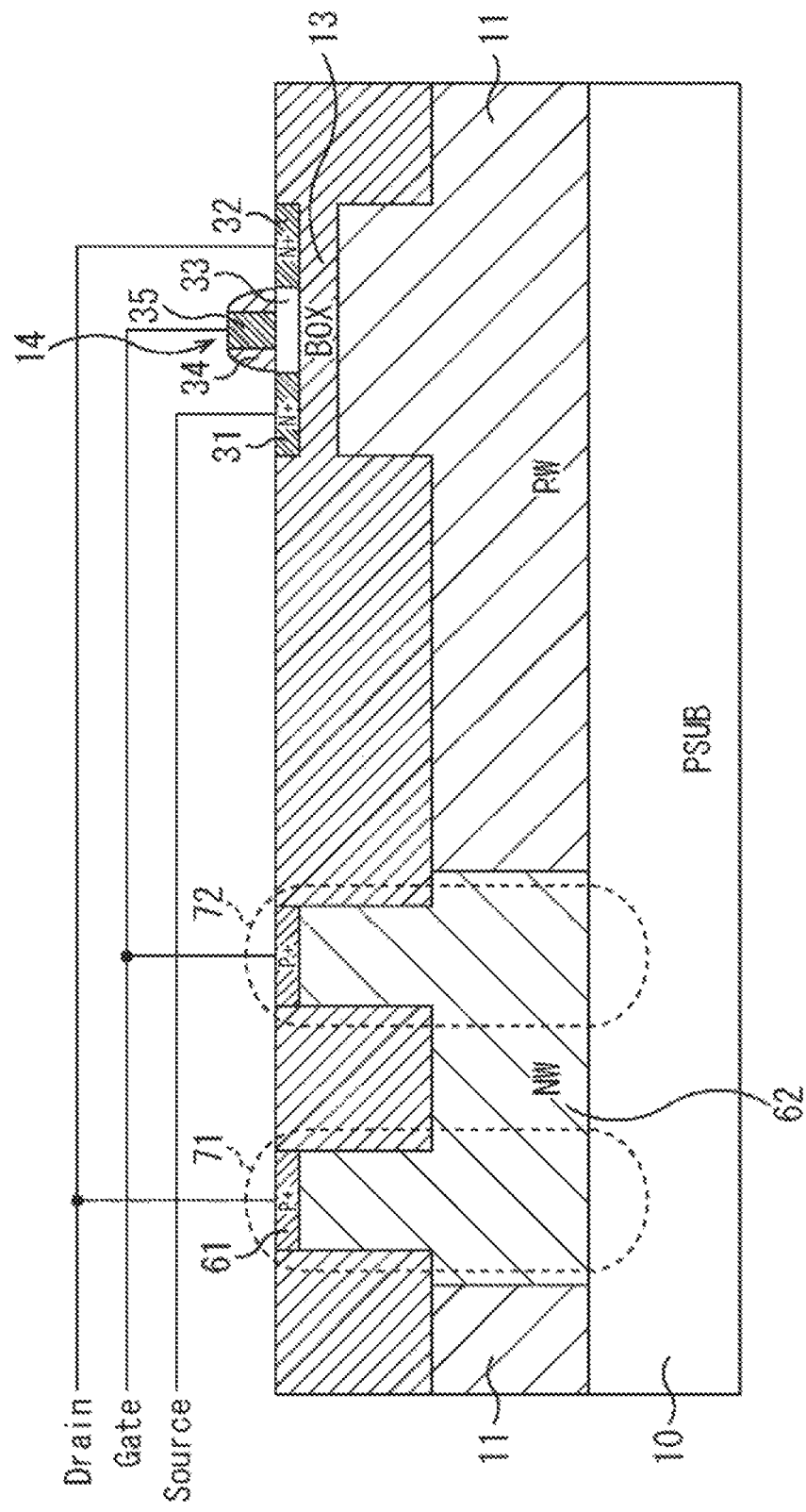
FIG. 14 is a cross-sectional view illustrating a seventh modification of the first configuration example illustrated in FIG. 6.

FIG. 14 illustrates a seventh modification of the first configuration example illustrated in FIG. 6. In the seventh modification, the protection element 73 is omitted from the first configuration example illustrated in FIG. 6. That is, the seventh modification forms the protection element 71 connected to the drain and the protection element 72 connected to the gate by using the unified N-type well region 62 as a shared well region.

This seventh modification also makes it possible to obtain operational effects similar to the first configuration example.

Eighth Modification of the First Embodiment

Figure 15:
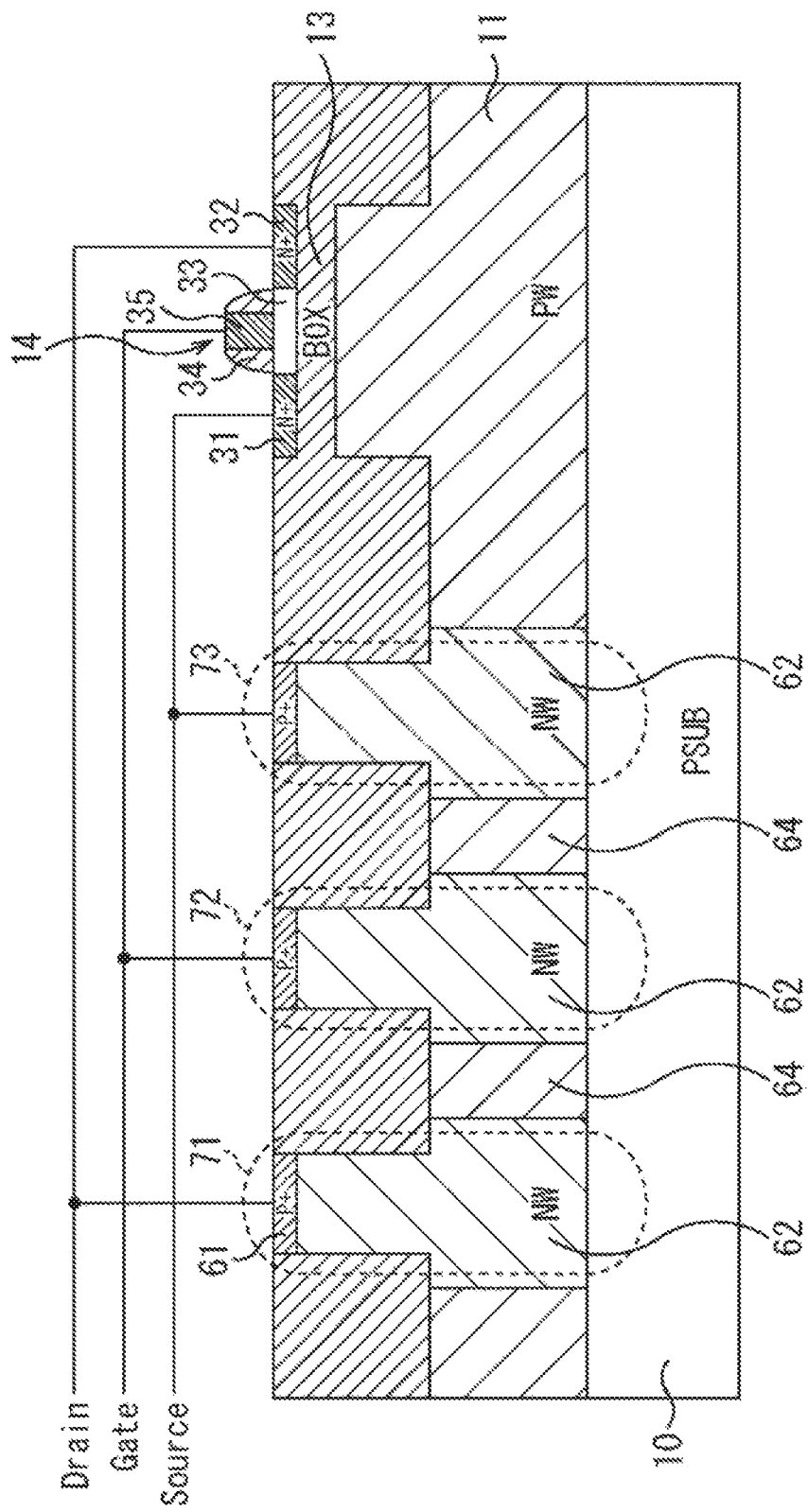
FIG. 15 is a cross-sectional view illustrating an eighth modification of the first configuration example illustrated in FIG. 6.

FIG. 15 illustrates an eighth modification of the first configuration example illustrated in FIG. 6. The first configuration example illustrated in FIG. 6 uses the unified N-type well region 62 as a shared well region included in the protection elements 71 to 73. In contrast, the eighth modification differs from the first configuration example in that the N-type well region 62 included in the protection elements 71 to 73 is isolated into three regions by the P-type well region 64.

The eighth modification can suppress the occurrence of the first problem described above.

Second Embodiment

Figure 16:
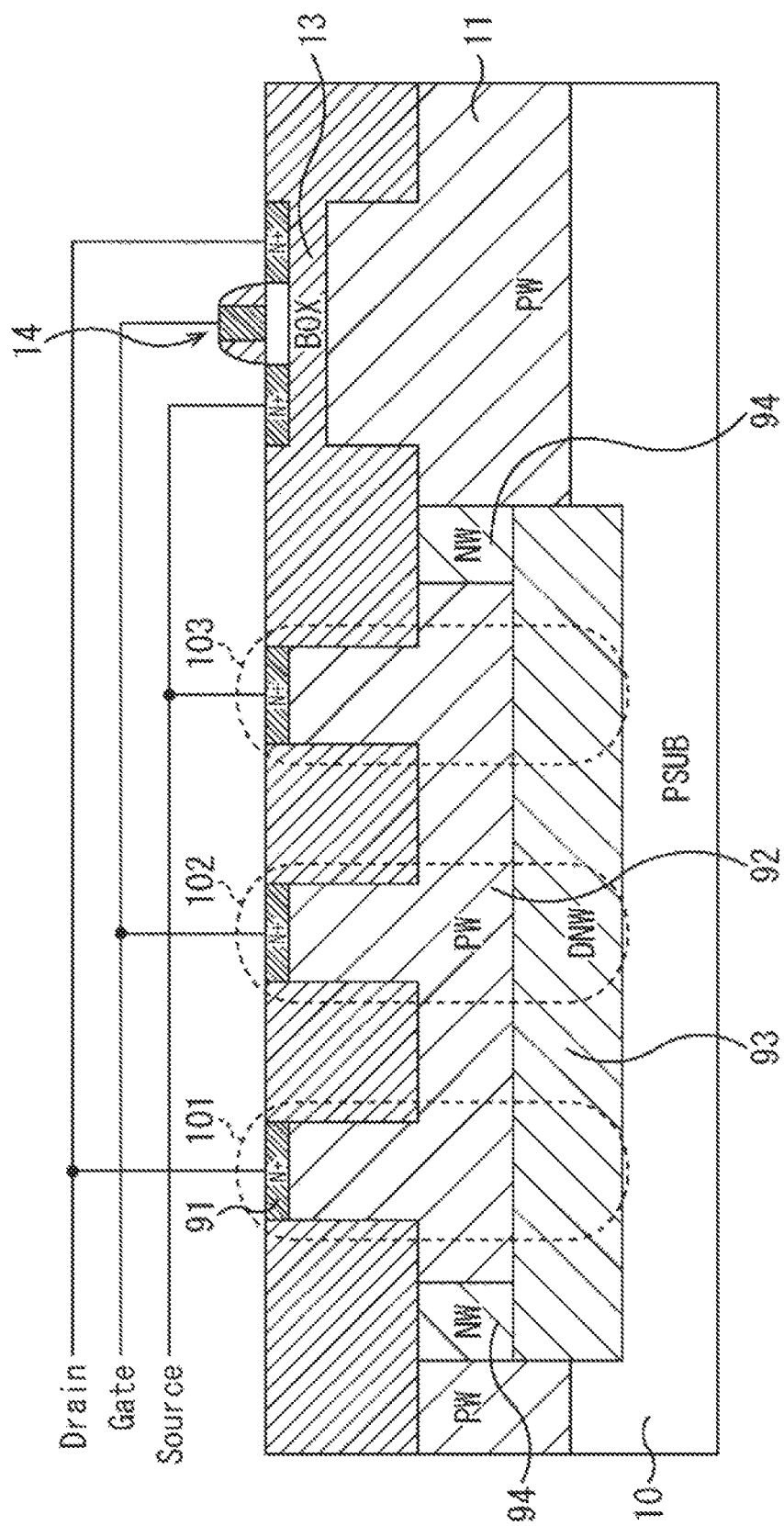
FIG. 16 is a cross-sectional view illustrating a second configuration example of a semiconductor device according to the present technology.

Next, FIG. 16 is a cross-sectional view illustrating a configuration example (second configuration example) of a semiconductor device according to a second embodiment of the present technology.

The second configuration example includes: a P-type semiconductor substrate 10 including Si; a BOX layer 13 provided on a P-type well region 11 on the P-type semiconductor substrate 10; and an N-type MOSFET 14 formed on the BOX layer 13. Note that the same reference numerals are given to the constituent elements common with the first configuration example, and the description thereof will be omitted as appropriate.

Protection elements 101, 102, and 103 are respectively connected to the drain layer 32, the gate electrode 35, and the source layer 31 of the N-type MOSFET 14. Each of the protection elements 101 to 103 includes: an N-type diffusion layer 91 having the conductivity type (in this case, N-type) opposite to the type of the P-type semiconductor substrate 10; a floating-state P-type well region 92 having the same conductivity type (in this case, P-type) as the type of the P-type semiconductor substrate 10 and having potential unfixed; and an N-type deep well region (DNW) 93 having a conductivity type (in this case, N-type) opposite to the type of the P-type semiconductor substrate 10.

The N-type diffusion layer 91 is formed in a surface region of the P-type semiconductor substrate 10. The P-type well region 92 is formed so as to surround the N-type diffusion layer 91. The P-type well regions 92 included in the protection elements 101 to 103 are unified as a shared well region. Furthermore, an N-type well region 94 is formed between the P-type well region 92 included in the protection elements 101 to 103 and the P-type well region 11 under the BOX layer 13 in order to electrically isolate these regions from each other.

The N-type deep well region 93 is a region where the concentration of the N-type impurity is higher than that of the N-type diffusion layer 91. The N-type deep well region 93 may be either in a floating state where the potential is unfixed, or in a state where the potential is fixed. The N-type deep well regions 93 included in the protection elements 101 to 103 are unified as a shared well region.

Figure 17:
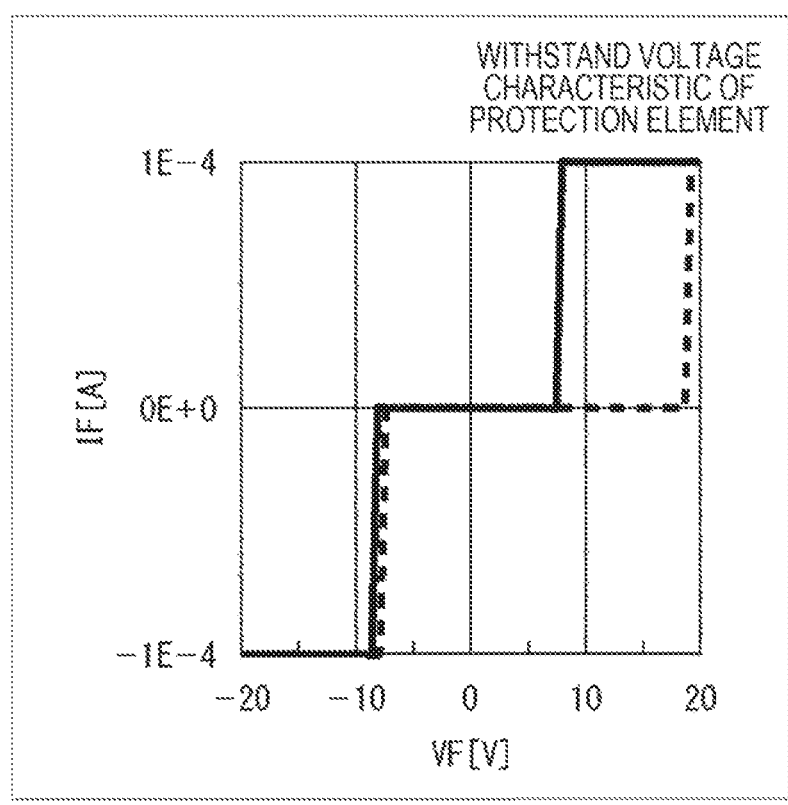
FIG. 17 is a graph illustrating a current-voltage characteristic of the protection element illustrated in FIG. 16.

FIG. 17 illustrates a current (IF)-voltage (VF) characteristic between the N-type diffusion layer 91 and the P-type semiconductor substrate 10 included in each of the protection elements 101 to 103. Note that a solid line in the figure illustrates a case where the N-type deep well region 93 is set in a floating state, while a broken line illustrates a case where the N-type deep well region 93 is fixed to the same potential as the P-type semiconductor substrate 10.

As illustrated in the figure, the protection elements 101 to 103 have withstand voltage characteristics of 5V or more with respect to both positive and negative potential differences irrespective of the state of the N-type deep well region 93.

Therefore, the second configuration example also makes it possible to obtain operational effects similar to the first configuration example.

First Modification of Second Embodiment

Figure 18:
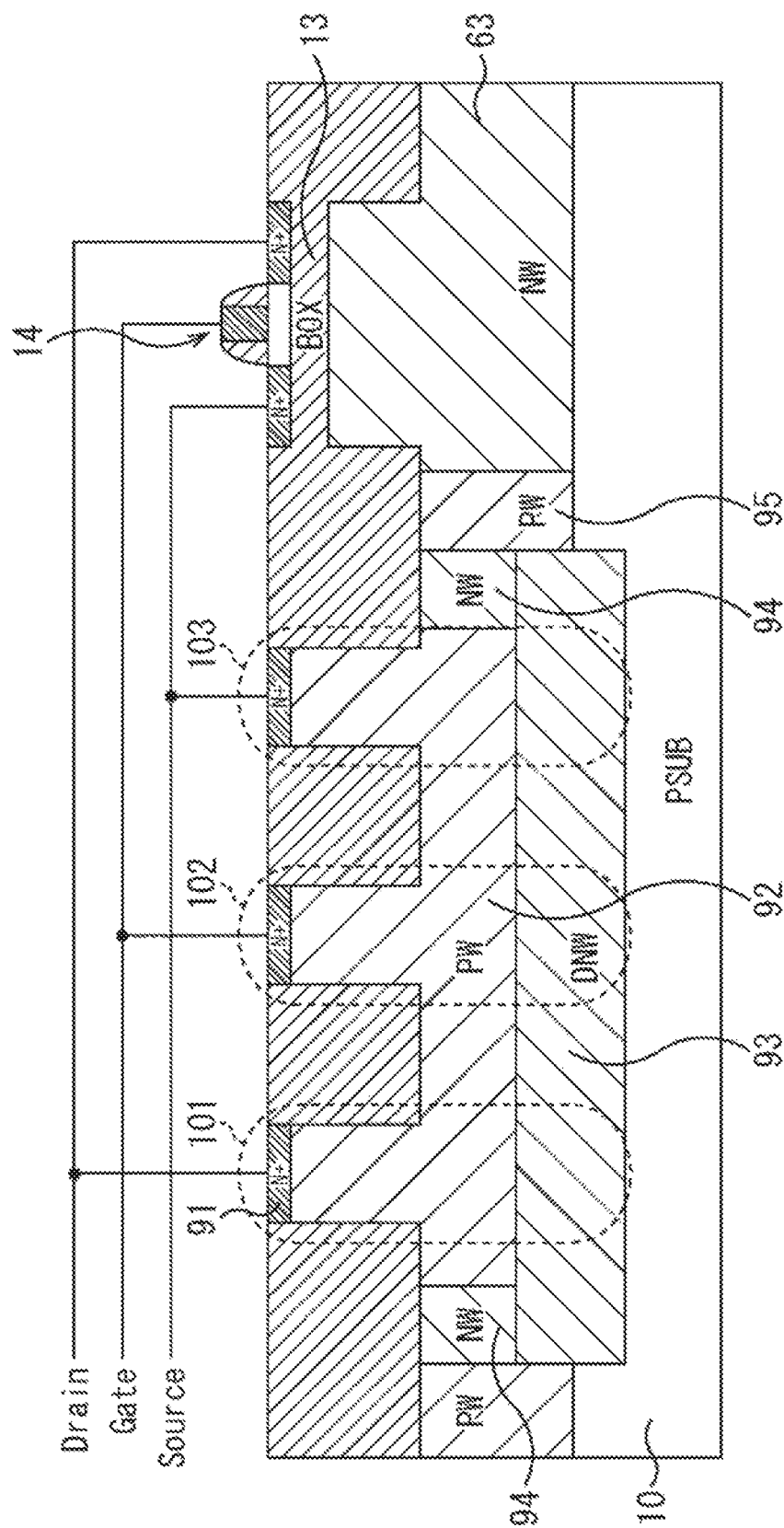
FIG. 18 is a cross-sectional view illustrating a first modification of the second configuration example illustrated in FIG. 16.

FIG. 18 illustrates a first modification of the second configuration example illustrated in FIG. 16. In the first modification, the P-type well region 11 below the N-type MOSFET 14 and the BOX layer 13 in the first configuration example illustrated in FIG. 16 has been replaced by the N-type well region 63. Furthermore, a P-type well region 95 has been added between the N-type well region 63 and the N-type well region 94 surrounding the P-type well region 92 included in the protection elements 101 to 103, in order to electrically isolate from each other.

This first modification also makes it possible to obtain operational effects similar to the second configuration example.

Second Modification of Second Embodiment

Figure 19:
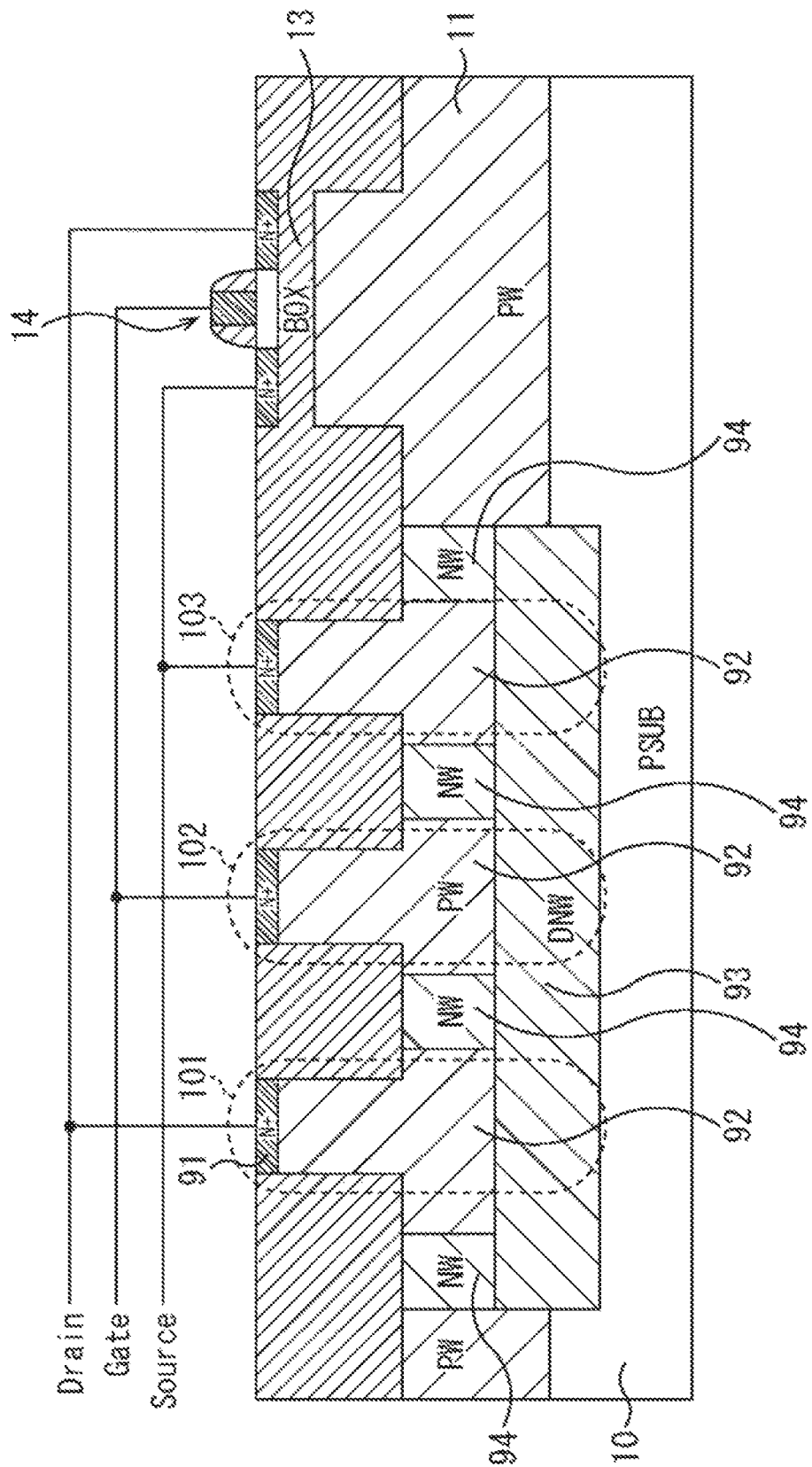
FIG. 19 is a cross-sectional view illustrating a second modification of the second configuration example illustrated in FIG. 16.

FIG. 19 illustrates a second modification of the second configuration example illustrated in FIG. 16. The second configuration example illustrated in FIG. 16 uses the unified P-type well region 92 included in the protection elements 101 to 103, as a shared well region. In the second modification, the N-type well region 94 has been added between the P-type well regions 92 corresponding to each of the protection elements 101 to 103 so as to electrically isolate the P-type well regions 92 individually corresponding to the protection elements 101 to 103 from each other. Note that the N-type deep well regions 93 included in the protection elements 101 to 103 are unified as they are, as a shared well region.

This second modification also makes it possible to obtain operational effects similar to the second configuration example.

Third Modification of the Second Embodiment

Figure 20:
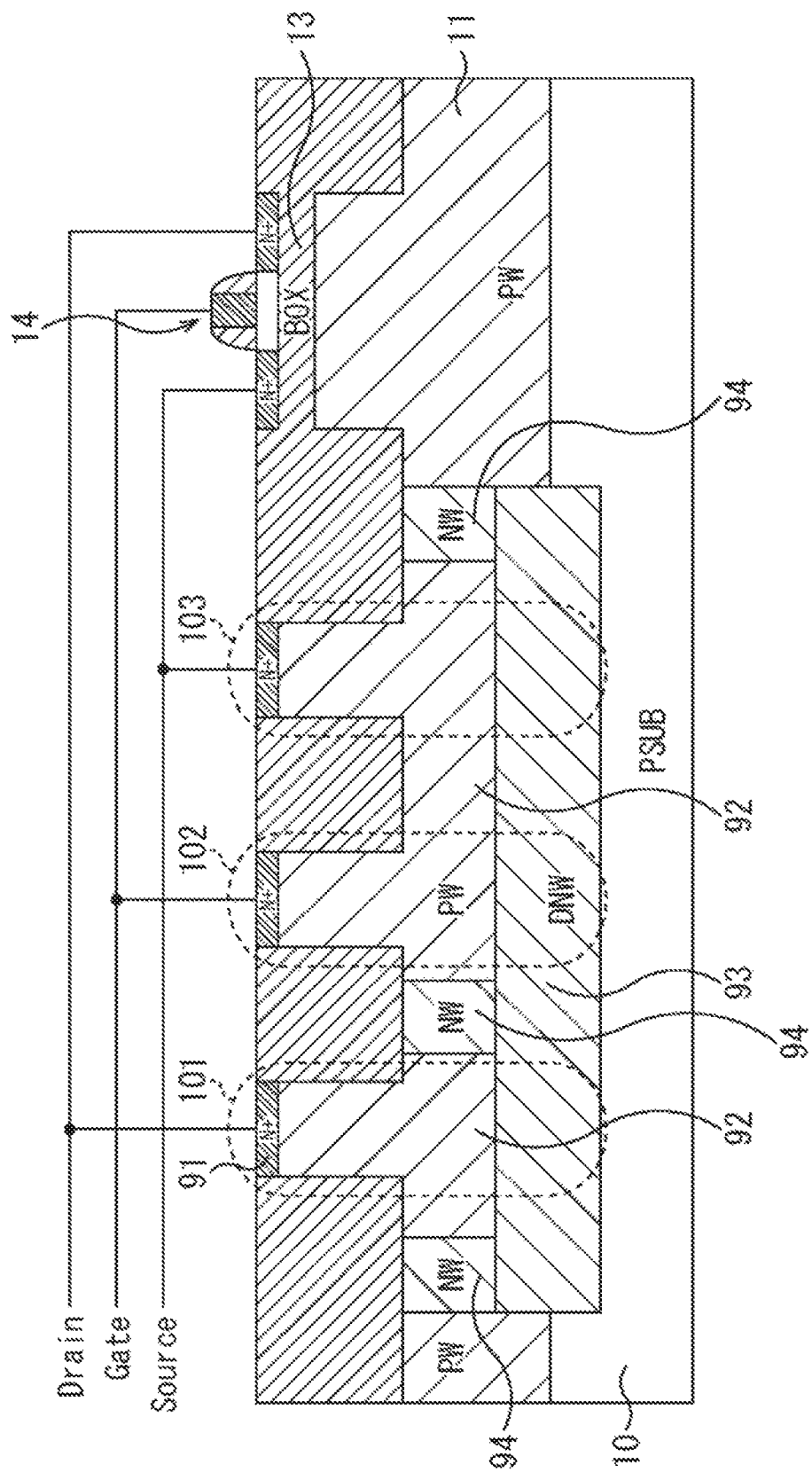
FIG. 20 is a cross-sectional view illustrating a third modification of the second configuration example illustrated in FIG. 16.

FIG. 20 illustrates a third modification of the second configuration example illustrated in FIG. 16. The second configuration example illustrated in FIG. 16 uses the unified P-type well region 92 included in the protection elements 101 to 103, as a shared well region. In the third modification, the N-type well region 94 has been added between the P-type well regions 92 included in the protection element 101 and the P-type well region 92 included in the protection elements 102 and 103 so as to electrically isolate the P-type well region 92 corresponding to the protection element 101 and the P-type well region 92 corresponding to the protection elements 102 and 103 from each other. Note that the N-type deep well regions 93 included in the protection elements 101 to 103 are unified as they are, as a shared well region.

This third modification also makes it possible to obtain operational effects similar to the second configuration example.

Fourth Modification of the Second Embodiment

Figure 21:
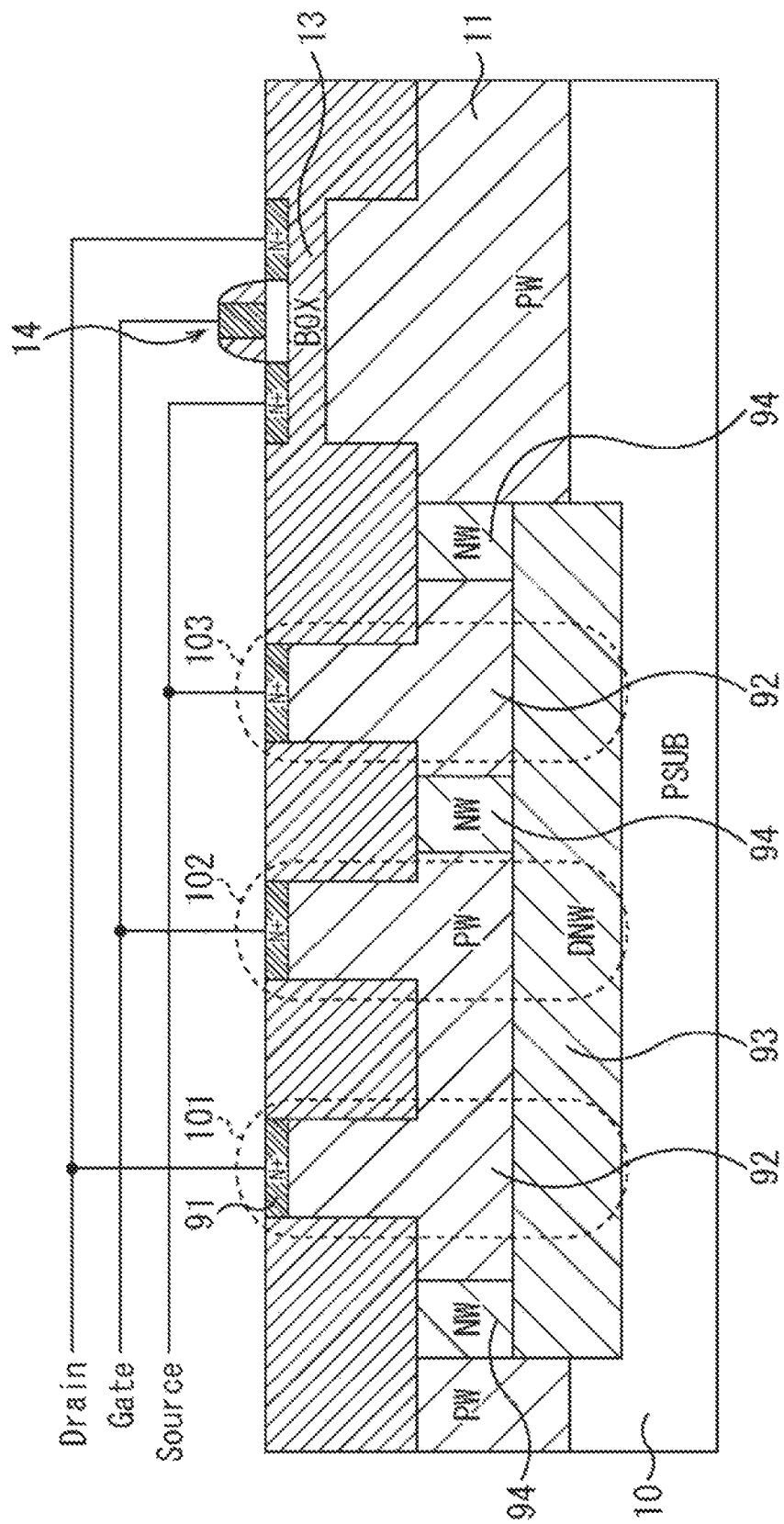
FIG. 21 is a cross-sectional view illustrating a fourth modification of the second configuration example illustrated in FIG. 16.

FIG. 21 illustrates a fourth modification of the second configuration example illustrated in FIG. 16. The second configuration example illustrated in FIG. 16 uses the unified P-type well region 92 included in the protection elements 101 to 103, as a shared well region. In the fourth modification, the N-type well region 94 has been added between the P-type well regions 92 included in the protection elements 101 and 102 and the P-type well region 92 included in the protection element 103 so as to electrically isolate the P-type well region 92 corresponding to the protection elements 101 and 102 and the P-type well region 92 corresponding to the protection element 103 from each other. Note that the N-type deep well regions 93 included in the protection elements 101 to 103 are unified as they are, as a shared well region.

This fourth modification also makes it possible to obtain operational effects similar to the second configuration example.

Fifth Modification of the Second Embodiment

Figure 22:
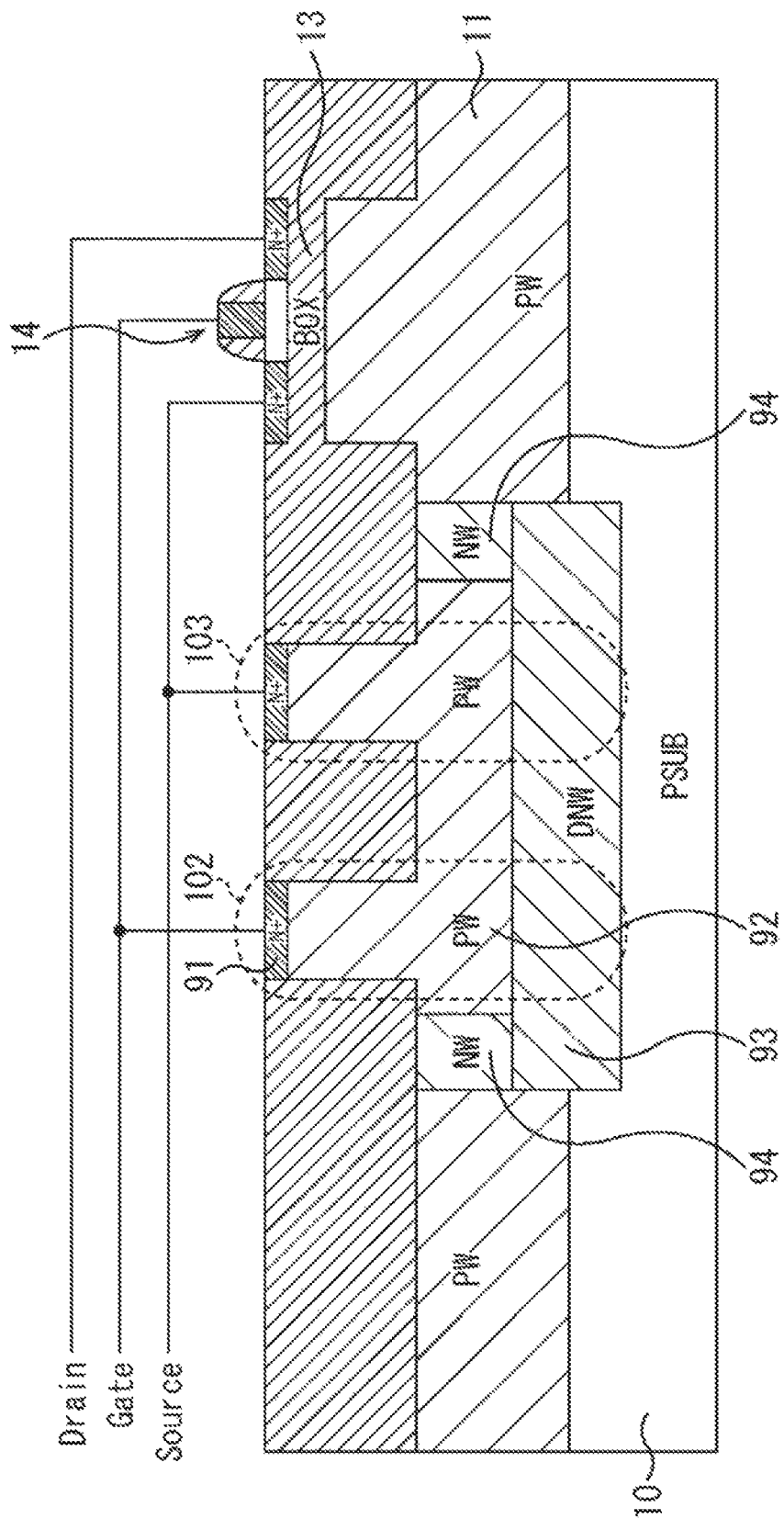
FIG. 22 is a cross-sectional view illustrating a fifth modification of the second configuration example illustrated in FIG. 16.

FIG. 22 illustrates a fifth modification of the second configuration example illustrated in FIG. 16. In the fifth modification, the protection element 101 has been omitted from the second configuration example illustrated in FIG. 16.

This fifth modification also makes it possible to obtain operational effects similar to the second configuration example.

Sixth Modification of the Second Embodiment

Figure 23:
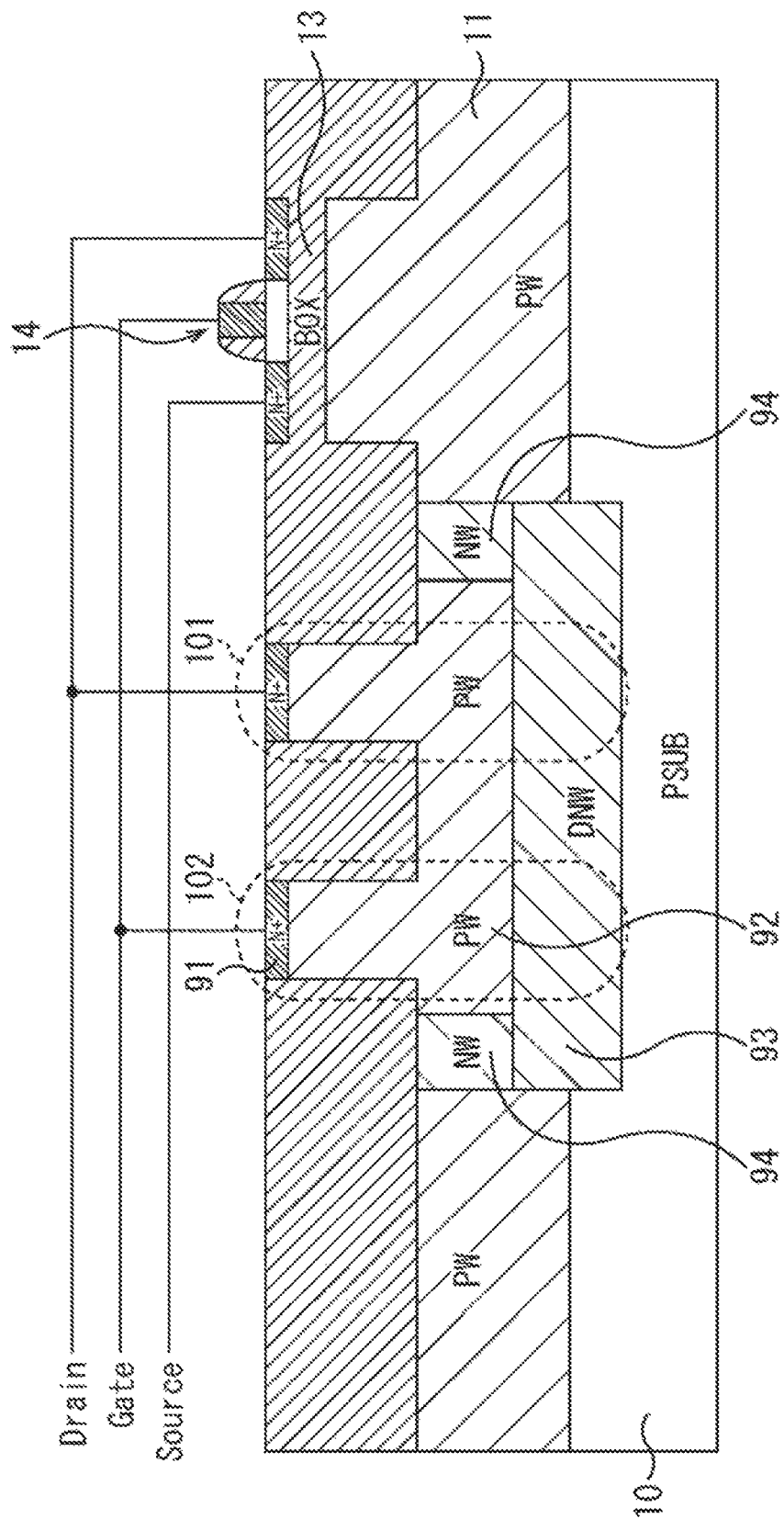
FIG. 23 is a cross-sectional view illustrating a sixth modification of the second configuration example illustrated in FIG. 16.

FIG. 23 illustrates a sixth modification of the second configuration example illustrated in FIG. 16. In the sixth modification, the protection element 103 has been omitted from the second configuration example illustrated in FIG. 16.

This sixth modification also makes it possible to obtain operational effects similar to the second configuration example.

Seventh Modification of the Second Embodiment

Figure 24:
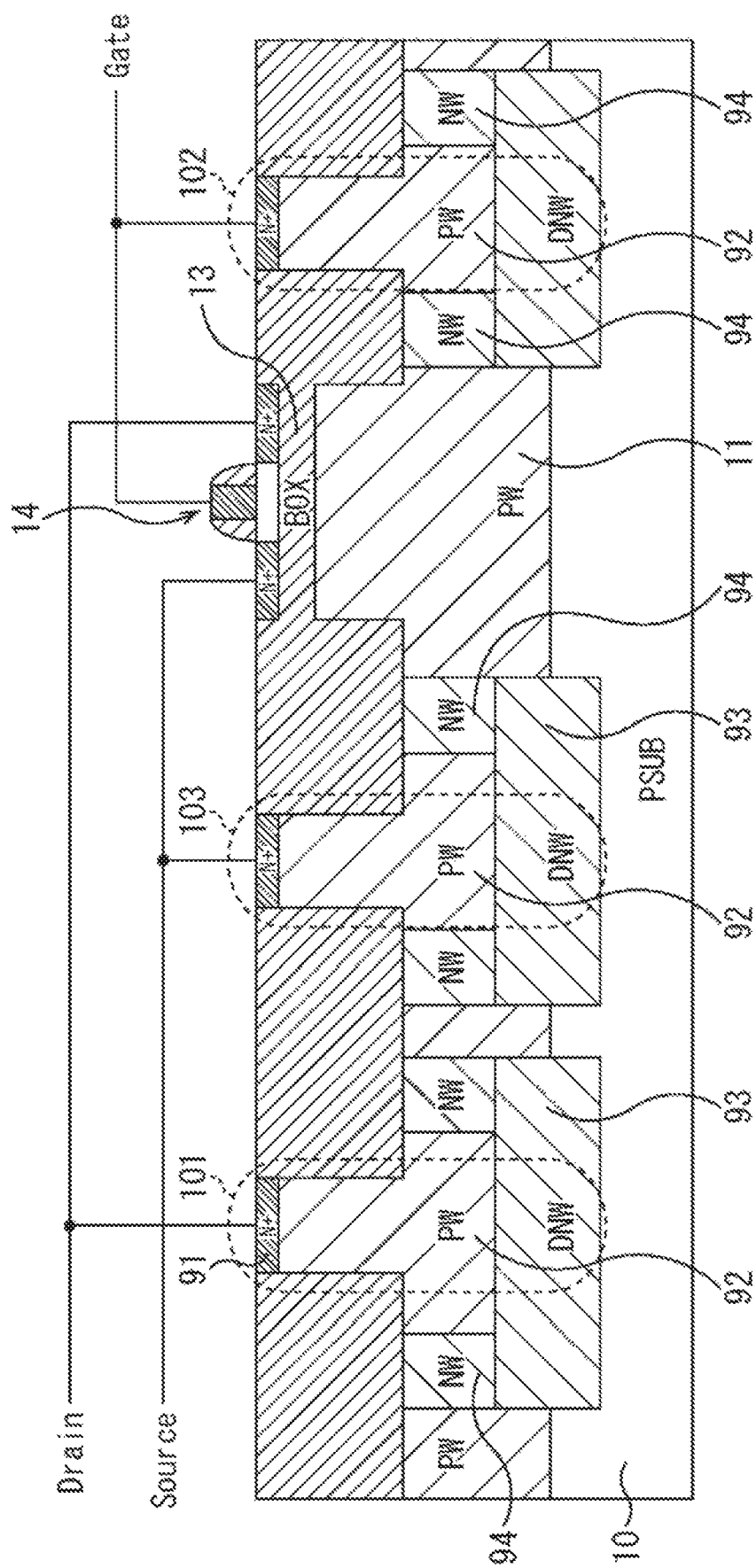
FIG. 24 is a cross-sectional view illustrating a seventh modification of the second configuration example illustrated in FIG. 16.

FIG. 24 illustrates a seventh modification of the second configuration example illustrated in FIG. 16. The second configuration example illustrated in FIG. 16 uses the unified P-type well region 92 and the unified N-type deep well region 93 included in the protection elements 101 to 103, each as a shared well region. In the seventh modification, the N-type well region 94 is formed between the P-type well regions 92 corresponding to each of the protection elements 101 to 103, while the N-type deep well regions 93 corresponding to each of the protection elements 101 to 103 are formed to be isolated from each other.

This seventh modification also makes it possible to obtain operational effects similar to the second configuration example.

Third Embodiment

Figure 25:
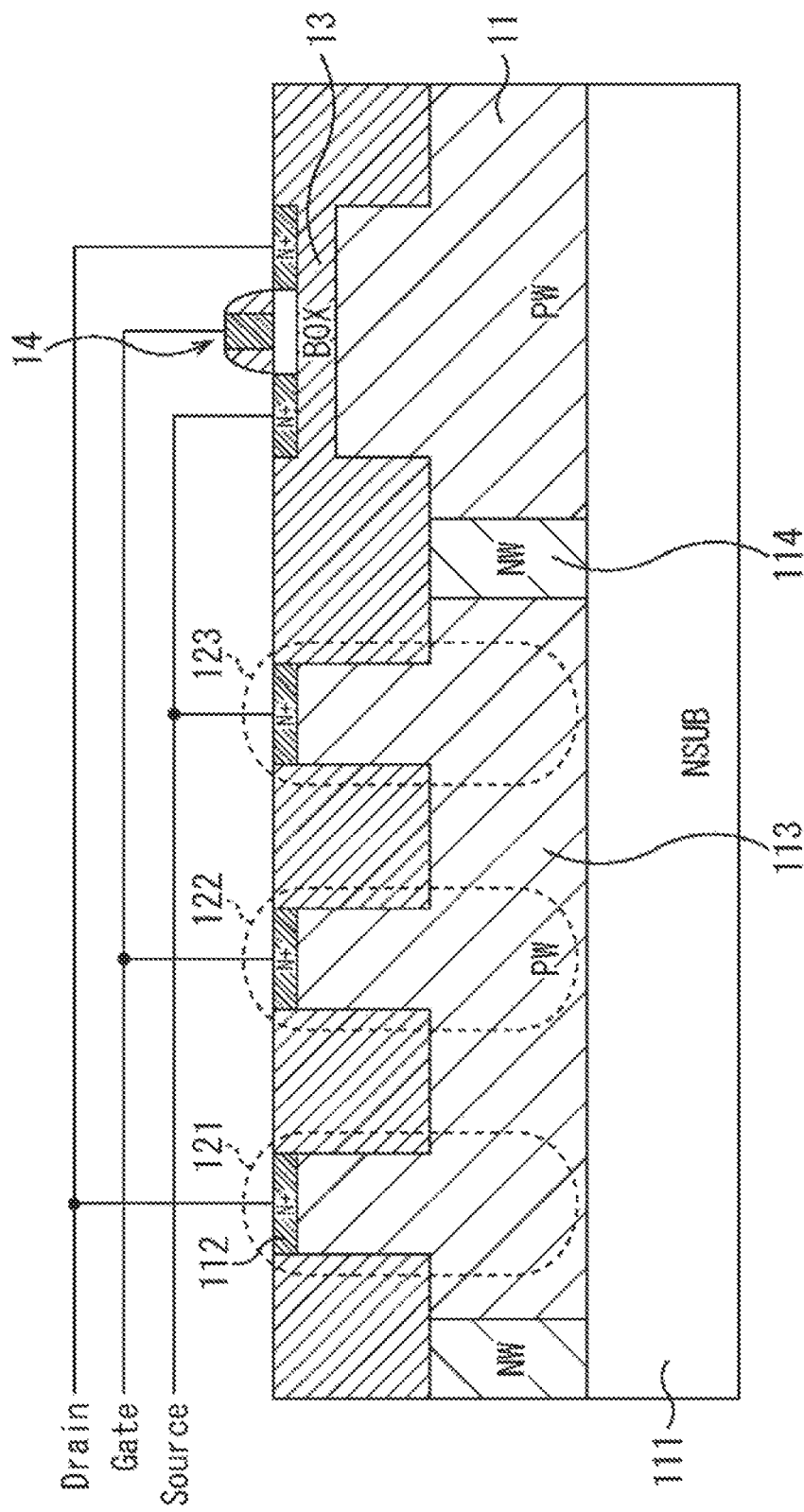
FIG. 25 is a cross-sectional view illustrating a third configuration example of a semiconductor device according to the present technology.

Next, FIG. 25 is a cross-sectional view illustrating a configuration example (third configuration example) of a semiconductor device according to a third embodiment of the present technology.

The third configuration example includes: an N semiconductor substrate (NSUB) 111 including Si, a BOX layer 13 provided on the P-type well region 11 on the N-type semiconductor substrate 111; and an N-type MOSFET 14 formed on the BOX layer 13.

Protection elements 121, 122, and 123 are respectively connected to the drain layer 32, the gate electrode 35, and the source layer 31 of the N-type MOSFET 14. The protection elements 121 to 123 includes: an N-type diffusion layer 112 having the same conductivity type (in this case, N-type) as the type of the N-type semiconductor substrate 111; a floating-state P-type well region 113 having a conductivity type (in this case, P-type) opposite to the type of the N-type semiconductor substrate 111 and having potential unfixed; and the N-type semiconductor substrate 111.

The N-type diffusion layer 112 is formed in a surface region of the N-type semiconductor substrate 111. The P-type well region 113 is formed so as to surround the N-type diffusion layer 112. The P-type well regions 113 included in the protection elements 121 to 123 are unified as a shared well region.

Note that an N-type well region 114 is formed between the P-type well region 11 under the BOX layer 13 and the P-type well region 113 included in the protection elements 121 to 123 in order to electrically isolate these regions from each other.

This third configuration example also makes it possible to obtain operational effects similar to the first configuration example.

Fourth Embodiment

Figure 26:
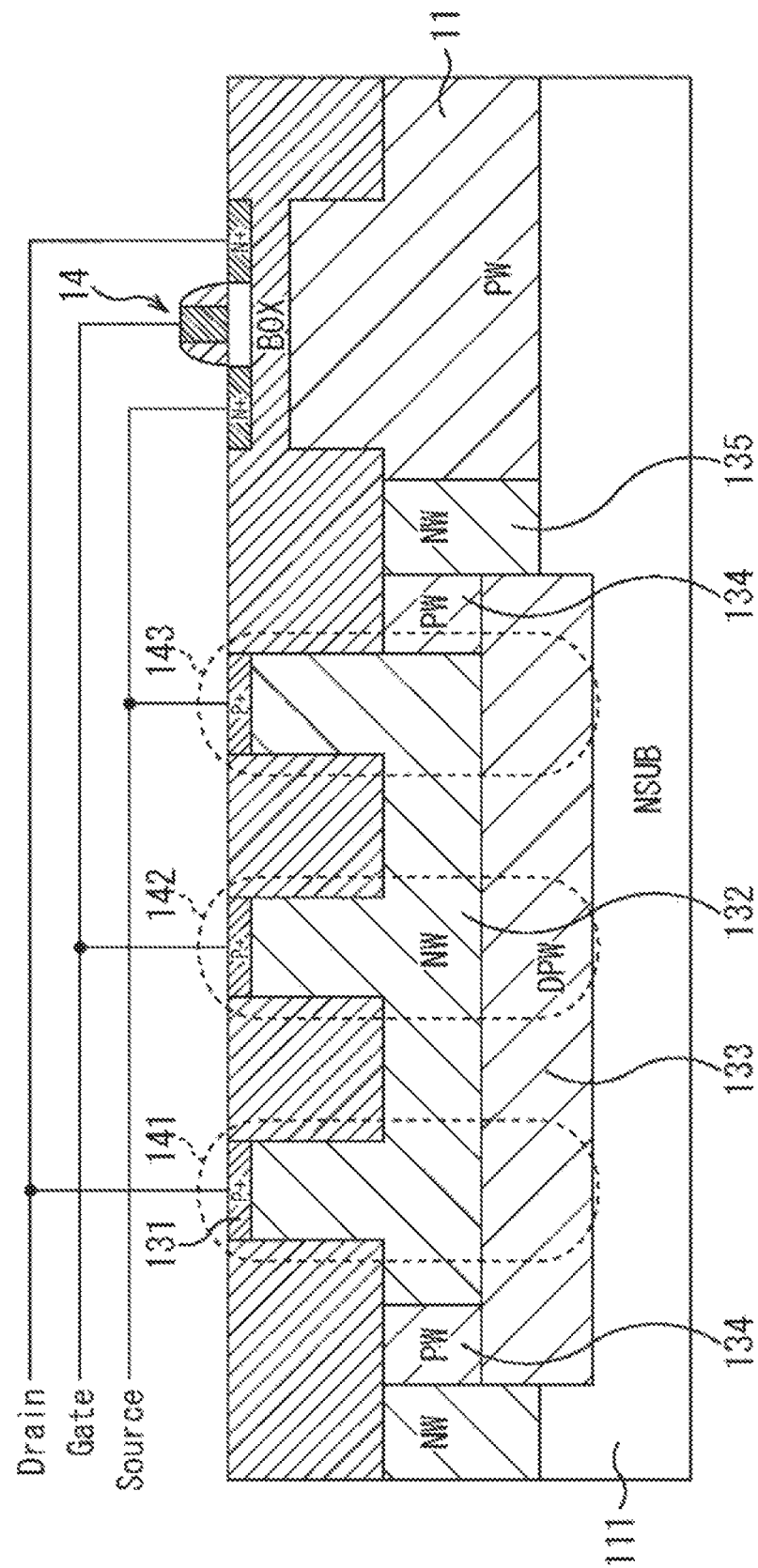
FIG. 26 is a cross-sectional view illustrating a fourth configuration example of a semiconductor device according to the present technology.

Next, FIG. 26 is a cross-sectional view illustrating a configuration example (fourth configuration example) of a semiconductor device according to a fourth embodiment of the present technology.

The fourth configuration example includes: an N-type semiconductor substrate 111 including Si; a BOX layer 13 provided on a P-type well region 11 on the N-type semiconductor substrate 111; and an N-type MOSFET 14 formed on the BOX layer 13. Note that the same reference numerals are given to the constituent elements common with the first configuration example, and the description thereof will be omitted as appropriate.

Protection elements 141, 142, and 143 are respectively connected to the drain layer 32, the gate electrode 35, and the source layer 31 of the N-type MOSFET 14. The protection elements 141 to 143 includes: a P-type diffusion layer 131 having the conductivity type (in this case, P-type) opposite to the type of the N-type semiconductor substrate 111; a floating-state N-type well region 132 having the same conductivity type (in this case, N-type) as the type of the N-type semiconductor substrate 111 and having potential unfixed; and a P-type deep well region (DPW) 133 having a conductivity type (in this case, P-type) opposite to the type of the N-type semiconductor substrate 111.

The P-type diffusion layer 131 is formed in a surface region of the N-type semiconductor substrate 111. The N-type well region 132 is formed so as to surround the P-type diffusion layer 131. The N-type well regions 132 included in the protection elements 141 to 143 are unified as a shared well region. Moreover, a P-type well region 134 is formed so as to surround the N-type well region 132. An N-type well region 135 is formed between the P-type well region 134 and the P-type well region 11 under the BOX layer 13 in order to electrically isolate these regions from each other.

The P-type deep well region 133 is a region where the concentration of the P-type impurity is higher than that of the P-type diffusion layer 131. The P-type deep well region 133 may be set either in a floating state where the potential is unfixed, or in a state where the potential is fixed. The N-type deep well region 93 included in the protection elements 141 to 143 is unified as a shared well region.

The current-voltage characteristics between the P-type diffusion layer 131 and the N-type semiconductor substrate 11 included in the protection elements 141 to 143 are similar to characteristics in the second configuration example.

Therefore, the fourth configuration example also makes it possible to obtain operational effects similar to the first configuration example.

Fifth Embodiment

Figure 27:
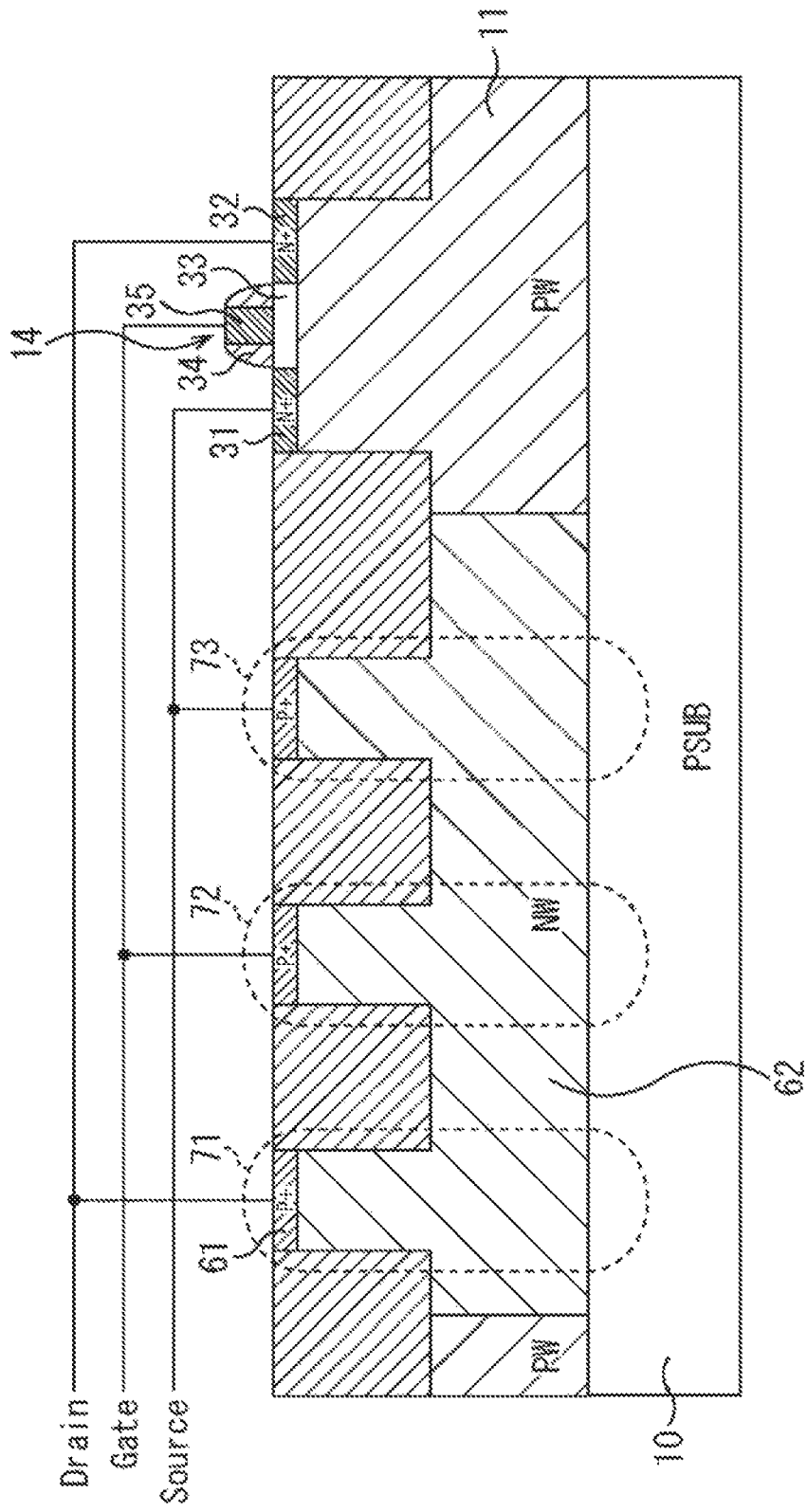
FIG. 27 is a cross-sectional view illustrating a fifth configuration example of a semiconductor device according to the present technology.

Next, FIG. 27 is a cross-sectional view illustrating a configuration example (fifth configuration example) of a semiconductor device according to a fifth embodiment of the present technology.

In the fifth configuration example, the BOX layer 13 has been omitted from the first configuration example illustrated in FIG. 6. That is, the N-type MOSFET 14 in the fifth configuration example has a bulk structure directly formed on the P-type well region 11 on the P-type semiconductor substrate 10.

The fifth configuration example also makes it possible to obtain operational effects similar to the first configuration example.

Sixth Embodiment

Figure 28:
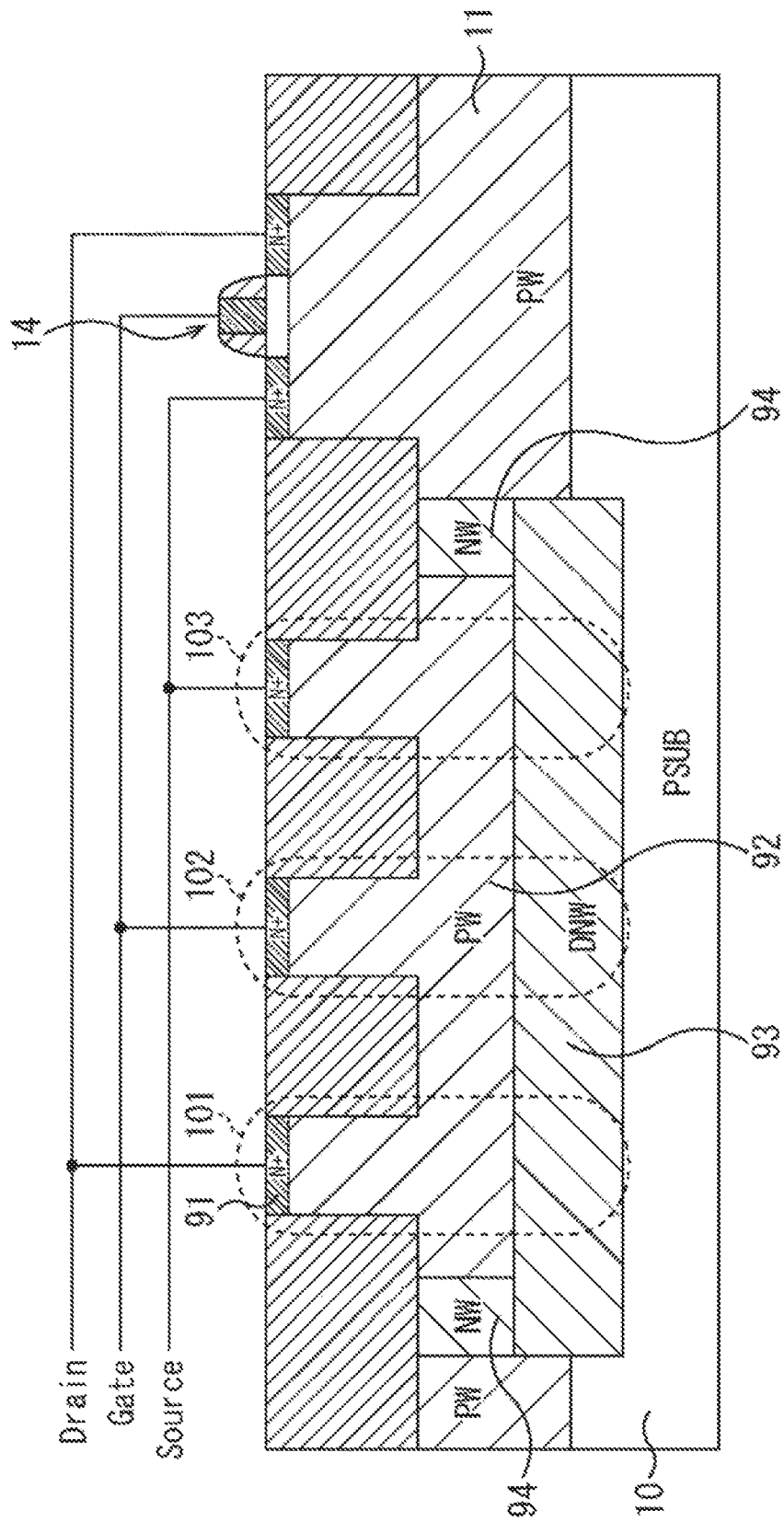
FIG. 28 is a cross-sectional view illustrating a sixth configuration example of a semiconductor device according to the present technology.

Next, FIG. 28 is a cross-sectional view illustrating a configuration example (sixth configuration example) of a semiconductor device according to a sixth embodiment of the present technology.

In the sixth configuration example, the BOX layer 13 has been omitted from the second configuration example illustrated in FIG. 16. That is, the N-type MOSFET 14 in the sixth configuration example has a bulk structure directly formed on the P-type well region 11 on the P-type semiconductor substrate 10.

The sixth configuration example also makes it possible to obtain operational effects similar to the first configuration example.

Seventh Embodiment

Figure 29:
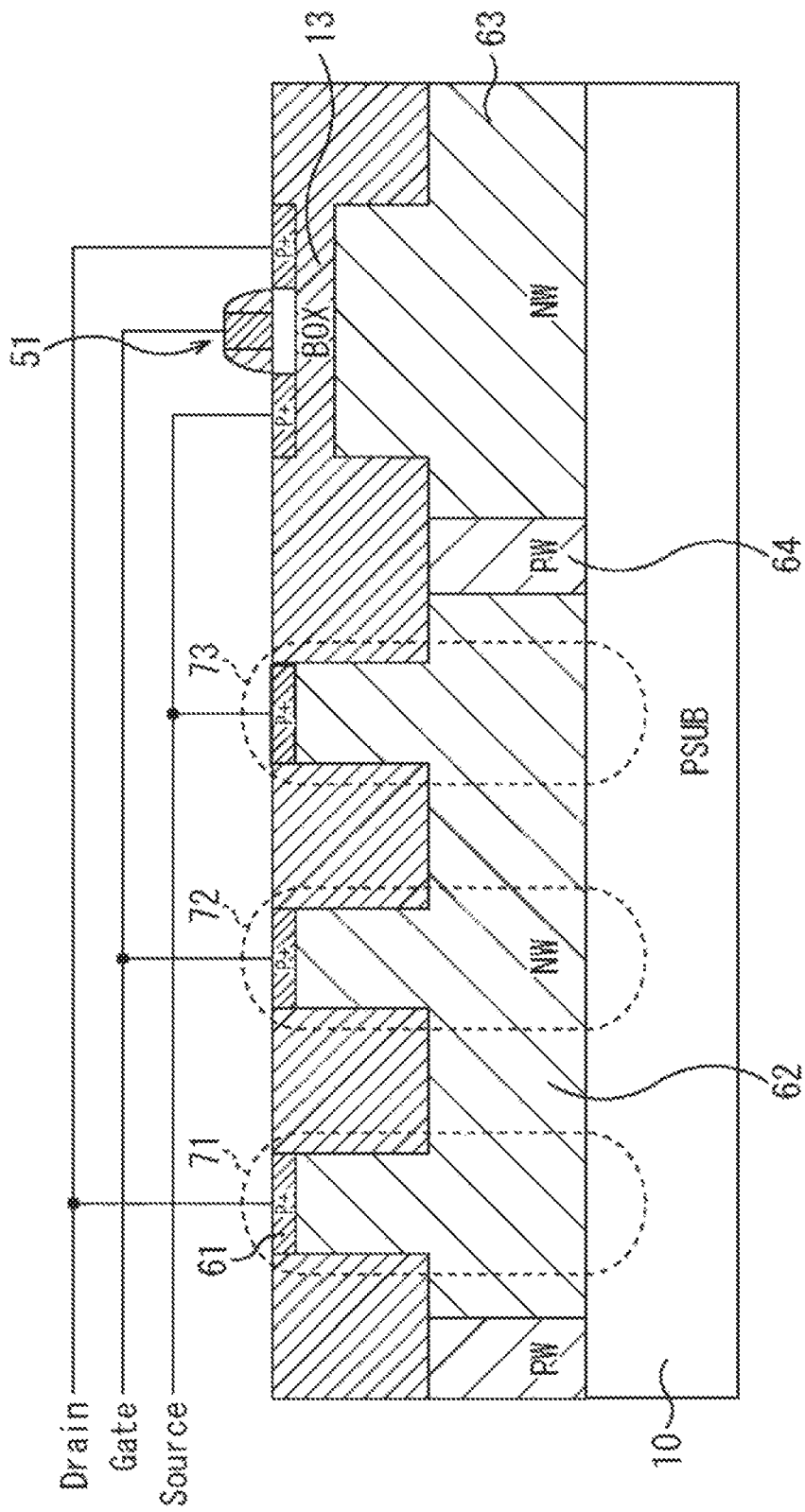
FIG. 29 is a cross-sectional view illustrating a seventh configuration example of a semiconductor device according to the present technology.

Next, FIG. 29 is a cross-sectional view illustrating a configuration example (seventh configuration example) of a semiconductor device according to a seventh embodiment of the present technology.

In the seventh configuration example, the N-type MOSFET 14 in the first modification of the first configuration example illustrated in FIG. 8 has been replaced by a P-type MOSFET 51.

The seventh configuration example also makes it possible to obtain operational effects similar to the first configuration example.

Eighth Embodiment

Figure 30:
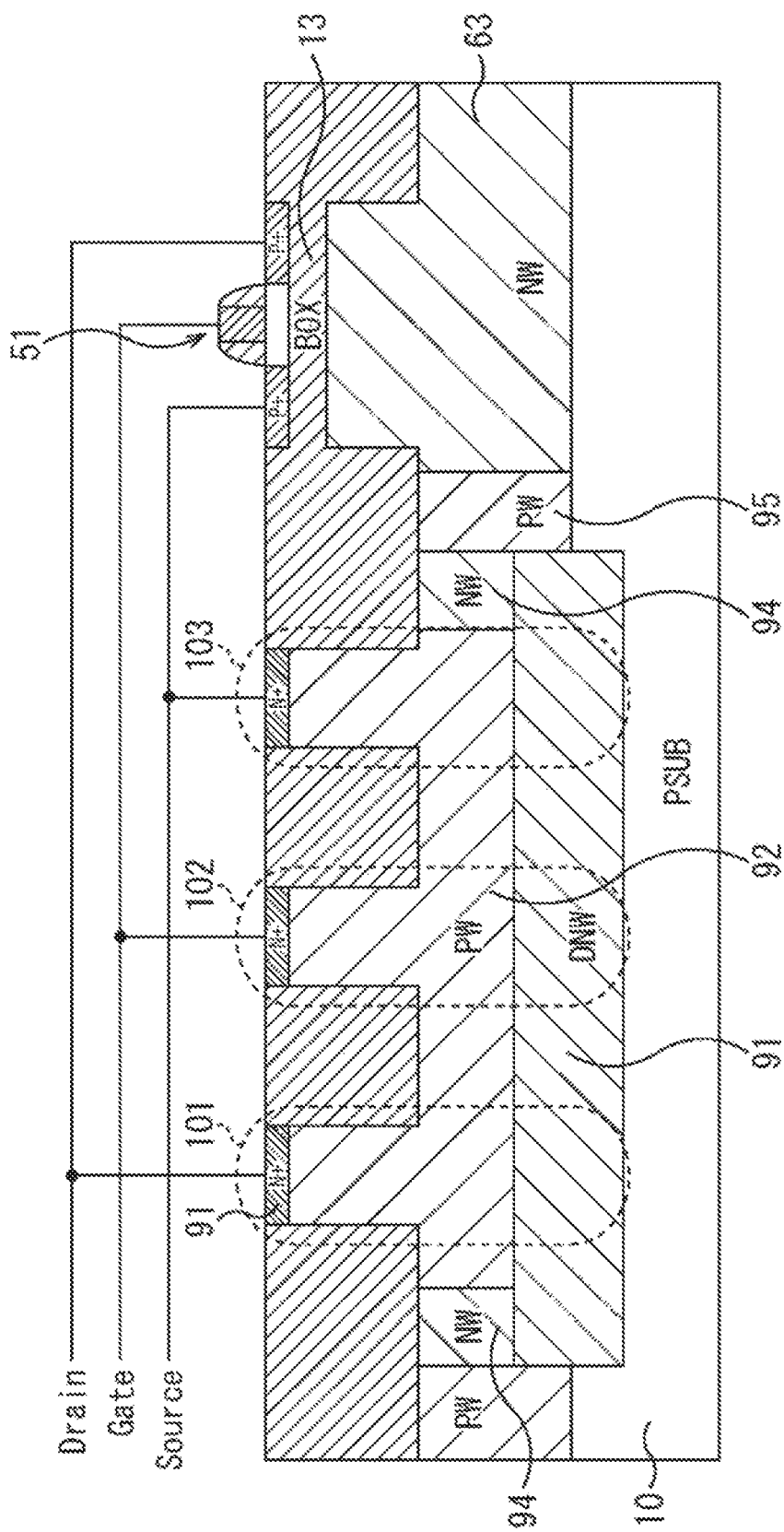
FIG. 30 is a cross-sectional view illustrating an eighth configuration example of a semiconductor device according to the present technology.

Next, FIG. 30 is a cross-sectional view illustrating a configuration example (eighth configuration example) of a semiconductor device according to an eighth embodiment of the present technology.

In the eighth configuration example, the N-type MOSFET 14 in the first modification of the second configuration example illustrated in FIG. 18 has been replaced by the P-type MOSFET 51.

The eighth configuration example also makes it possible to obtain operational effects similar to the first configuration example.

Ninth Embodiment

Figure 31:
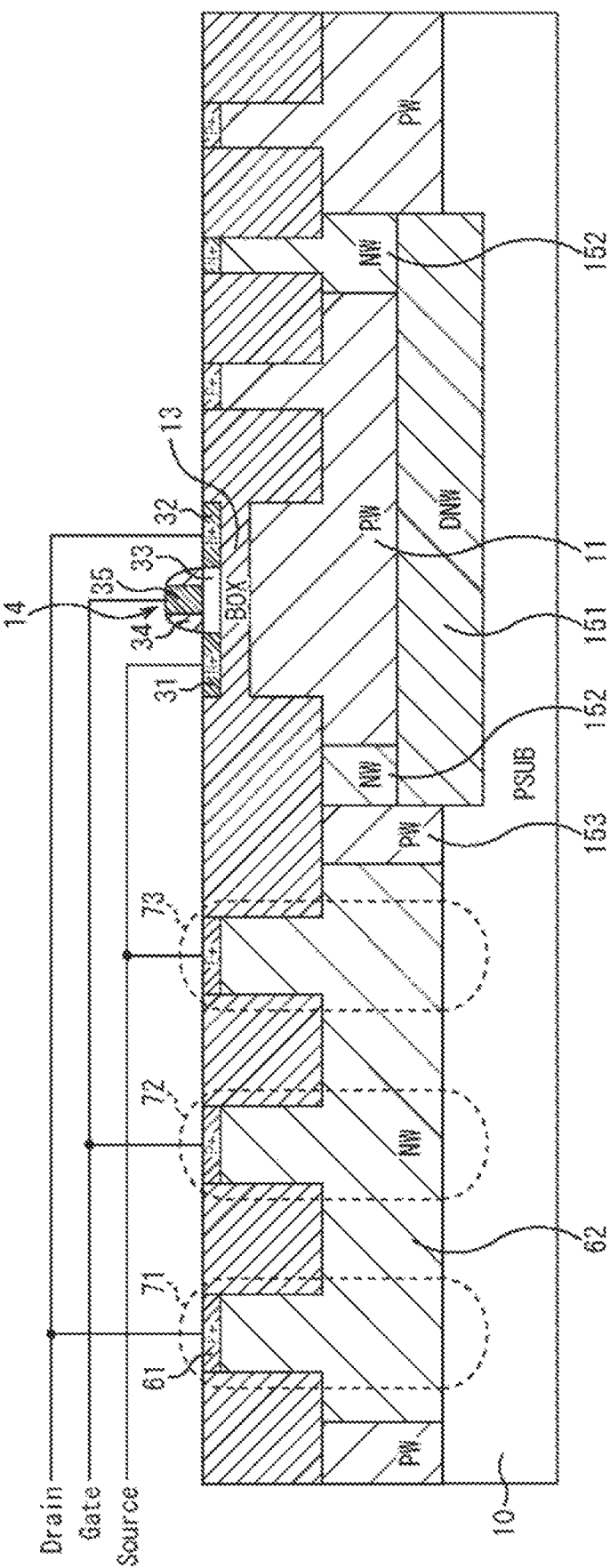
FIG. 31 is a cross-sectional view illustrating a ninth configuration example of a semiconductor device according to the present technology.

Next, FIG. 31 is a cross-sectional view illustrating a configuration example (ninth configuration example) of a semiconductor device according to a ninth embodiment of the present technology.

In the ninth configuration example, an N-type deep well region 151 is formed between the P-type semiconductor substrate 10 and the P-type well region 11, and an N-type well region 152 is formed in the horizontal direction of the P-type well region 11 so as to surround the P-type well region 11 under the BOX layer 13 in the first configuration example illustrated in FIG. 6. Furthermore, a P-type well region 153 is formed between the N-type well region 152 and the N-type well region 62 in order to isolate these regions from each other.

The ninth configuration example also makes it possible to obtain operational effects similar to the first configuration example.

Application Example of Present Embodiment

The above-described first to ninth configuration examples and their modifications (hereinafter collectively referred to as the present embodiment) are applicable to various types of electronic devices including MOSFET mounted on an electronic substrate. More specifically, the present embodiment is applicable to CMOS image sensors, CPUs for servers, CPUs for PCs, CPUs for game machines, mobile devices, measuring devices, AV devices, communication devices, various home appliances, or the like.

For example, the present embodiment is applicable to a comparator of an ADC that performs AD conversion of an analog voltage signal output from a pixel array in a CMOS image sensor.

Note that in a case where the present embodiment is applied to an electronic device, the above-described first to ninth configuration examples and their modifications may be combined as appropriate.

Embodiments of the present technology are not limited to the above-described embodiments but can be modified in a variety of ways without departing from the scope of the present technology.

The present technology may also be configured as follows.

(1)

A semiconductor device including:

a MOSFET as a protected element formed on a semiconductor substrate; and a protection element that suppresses electrical damage to the protected element formed on the semiconductor substrate, in which the protection element includes:

the semiconductor substrate;

one or more layers of well regions formed on the semiconductor substrate; and a diffusion layer formed on the well region.

(2)

The semiconductor device according to (1), in which the protection element includes:

the semiconductor substrate;

the well region having a conductivity type opposite to the type of the semiconductor substrate; and the diffusion layer having the same conductivity type as the type of the semiconductor substrate.

(3)

The semiconductor device according to (1) or (2), in which the well region is set in a floating state.

(4)

The semiconductor device according to any of (1) to (3), in which the protection element includes:

a first protection element connected to a drain layer of the MOSFET;

a second protection element connected to a gate electrode of the MOSFET; and a third protection element connected to a source layer of the MOSFET, and the diffusion layer included in each of the first to third protection elements is isolated from each other.

(5)

The semiconductor device according to (4), in which the well region included in the second protection element is unified together with at least one of the well region included in the first protection element or the well region included in the third protection element, as a shared well region.

(6)

The semiconductor device according to (4), in which the well regions individually included in the first to third protection elements are isolated from each other.

(7)

The semiconductor device according to any of (4) to (6), in which the first protection element or the third protection element out of the first to third protection elements is omitted.

(8)

The semiconductor device according to (1), in which the protection element includes:

the semiconductor substrate;

a first well region formed on the semiconductor substrate and having a conductivity type opposite to the type of the semiconductor substrate;

a second well region formed on the first well region and having a same conductivity type as the type of the semiconductor substrate; and the diffusion layer having the conductivity type opposite to the type of the semiconductor substrate.

(9)

The semiconductor device according to (8), in which the second well region is set in a floating state.

(10)

The semiconductor device according to (8) or (9), in which the first well region is set in a floating state.

(11)

The semiconductor device according to (8) or (9), in which the first well region is set in a fixed potential state.

(12)

The semiconductor device according to any of (8) to (11), in which the protection element includes:

a first protection element connected to a drain layer of the MOSFET;

a second protection element connected to a gate electrode of the MOSFET; and a third protection element connected to a source layer of the MOSFET, and the diffusion layer included in each of the first to third protection elements is isolated from each other.

(13)

The semiconductor device according to (8), in which the second well region included in the second protection element is unified together with at least one of the second well region included in the first protection element or the second well region included in the third protection element, as a shared well region.

(14)

The semiconductor device according to (8), in which the second well regions individually included in the first to third protection elements are isolated from each other.

(15)

The semiconductor device according to any of (8) to (14), in which the first well regions individually included in the first to third protection elements are unified as a shared well region.

(16)

The semiconductor device according to any of (8) to (14), in which the first well regions individually included in the first to third protection elements are isolated from each other.

(17)

The semiconductor device according to any of (8) to (16), in which the first protection element or the third protection element out of the first to third protection elements is omitted.

(18)

The semiconductor device according to any of (1) to (17), further including a buried insulating layer formed under the MOSFET.

(19)

A protection element that suppresses electrical damage to a protected element formed on a semiconductor substrate, the protection element including:
the semiconductor substrate;
the well region formed on the semiconductor substrate and having a conductivity type opposite to the type of the semiconductor substrate; and
the diffusion layer formed on the well region and having the same conductivity type as the type of the semiconductor substrate.

(20)

A protection element that suppresses electrical damage to a protected element formed on a semiconductor substrate, the protection element including:
the semiconductor substrate;
a first well region formed on the semiconductor substrate and having a conductivity type opposite to the type of the semiconductor substrate;
a second well region formed on the first well region and having the same conductivity type as the type of the semiconductor substrate; and
the diffusion layer formed on the second well region and having the conductivity type opposite to the type of the semiconductor substrate.

REFERENCE SIGNS LIST

10 P-type semiconductor substrate
11 P-type well region
12 N-type diffusion layer
13 BOX layer
14 N-type MOSFET
21 to 23 Protection diode
31 Source layer
32 Drain layer
33 Channel layer
34 Gate insulating film
35 Gate electrode
51 P-type MOSFET
52 P-type diffusion layer
53 N-type well region
61 P-type diffusion layer
62 N-type well region
63 N-type well region
64 P-type well region
71 to 73 Protection element
91 N-type diffusion layer
92 P-type well region
93 N-type deep well region
94 N-type well region
101 to 103 Protection element
111 N-type semiconductor substrate
112 N-type diffusion layer
113 P-type well region
114 N-type well region
121 to 123 Protection element
131 P-type diffusion layer
132 N-type well region
133 P-type deep well region
134 P-type well region
135 N-type well region
141 to 143 Protection element
151 N-type deep well region
152 N-type well region
153 P-type well region

The invention claimed is:

1. A semiconductor device, comprising:
a semiconductor substrate;
a metal-oxide-semiconductor field-effect transistor (MOSFET) as a protected element on the semiconductor substrate; and
a protection element that includes:
a first protection element connected to a drain layer of the MOSFET;
a second protection element connected to a gate electrode of the MOSFET; and
a third protection element connected to a source layer of the MOSFET, wherein
each of the first protection element, the second protection element, and the third protection element includes:
the semiconductor substrate;
a well region on the semiconductor substrate, wherein the well region has a conductivity type opposite to a conductivity type of the semiconductor substrate; and
a diffusion layer on the well region,
the diffusion layer has a conductivity type same as the conductivity type of the semiconductor substrate,
the diffusion layer in the first protection element is spaced apart from each of the diffusion layer in the second protection element, and the diffusion layer in the third protection element, and
the diffusion layer in the second protection element is spaced apart from the diffusion layer in the third protection element.

2. The semiconductor device according to claim 1, wherein the well region is set in a floating state.

3. The semiconductor device according to claim 1, further comprising a shared well region that includes:
the well region in the second protection element, and
at least one of the well region in the first protection element or the well region in the third protection element.

4. The semiconductor device according to claim 1, wherein
the well region in the first protection element is spaced apart from each of the well region in the second protection element, and the well region in the third protection element, and
the well region in the second protection element is spaced apart from the well region in the third protection element.

5. The semiconductor device according to claim 1, further comprising a buried insulating layer under the MOSFET.

6. A protection element, comprising:
a first protection element connected to a drain layer of a metal-oxide-semiconductor field-effect transistor (MOSFET);
a second protection element connected to a gate electrode of the MOSFET; and
a third protection element connected to a source layer of the MOSFET, wherein
each of the first protection element, the second protection element, and the third protection element includes:
a semiconductor substrate;
a well region on the semiconductor substrate, wherein the well region has a conductivity type opposite to a conductivity type of the semiconductor substrate; and a diffusion layer formed on the well region, the diffusion layer has a conductivity type same as the conductivity as the type of the semiconductor substrate, the diffusion layer in the first protection element is spaced apart from each of the diffusion layer in the second protection element, and the diffusion layer in the third protection element, and the diffusion layer in the second protection element is spaced apart from the diffusion layer in the third protection element.

7. A protection element, comprising:

a first protection element connected to a drain layer of a metal-oxide-semiconductor field-effect transistor (MOSFET);

a second protection element connected to a gate electrode of the MOSFET; and a third protection element connected to a source layer of the MOSFET, wherein each of the first protection element, the second protection element, and the third protection element includes:

a semiconductor substrate;

a first well region on the semiconductor substrate, wherein the first well region has a conductivity type opposite to a conductivity type of the semiconductor substrate;

a second well region on the first well region, wherein the second well region has a conductivity type same as the conductivity type of the semiconductor substrate; and a diffusion layer on the second well region, the diffusion layer has a and having the conductivity type opposite to the conductivity type of the semiconductor substrate, the diffusion layer in the first protection element is spaced apart from each of the diffusion layer in the second protection element, and the diffusion layer in the third protection element, and the diffusion layer in the second protection element is spaced apart from the diffusion layer in the third protection element.

8. A semiconductor device, comprising:

a semiconductor substrate;

a metal-oxide-semiconductor field-effect transistor (MOSFET) as a protected element on the semiconductor substrate; and a protection element that includes:

a first protection element connected to a drain layer of the MOSFET;

a second protection element connected to a gate electrode of the MOSFET; and a third protection element connected to a source layer of the MOSFET, wherein each of the first protection element, the second protection element, and the third protection element includes:

the semiconductor substrate;

a first well region on the semiconductor substrate, wherein the first well region has a conductivity type opposite to a conductivity type of the semiconductor substrate;

a second well region on the first well region, wherein the second well region has a conductivity type same as the conductivity type of the semiconductor substrate; and a diffusion layer on the second well region, the diffusion layer has a conductivity type opposite to the conductivity type of the semiconductor substrate, the diffusion layer in the first protection element is spaced apart from each of the diffusion layer in the second protection element, and the diffusion layer in the third protection element, and the diffusion layer in the second protection element is spaced apart from the diffusion layer in the third protection element.

9. The semiconductor device according to claim 8, wherein the second well region is set in a floating state.

10. The semiconductor device according to claim 9, wherein the first well region is set in the floating state.

11. The semiconductor device according to claim 9, wherein the first well region is set in a fixed potential state.

12. The semiconductor device according to claim 8, further comprising a shared well region that includes:

the second well region in the second protection element, and at least one of the second well region in the first protection element or the second well region in the third protection element.

13. The semiconductor device according to claim 8, wherein the second well region in the first protection element is spaced apart from each of the second well region in the second protection element and the second well region in the third protection element, and the second well region in the second protection element is spaced apart from the second well region in the third protection element.

14. The semiconductor device according to claim 8, further comprising a shared well region that includes:

the first well region in the first protection element, the first well region in the second protection element, and the first well region in the third protection element.

15. The semiconductor device according to claim 8, wherein the first well region in the first protection element is spaced apart from each of the first well region in the second protection element, and the first well region in the third protection element, and the first well region in the second protection element is spaced apart from the first well region in the third protection element.

\* \* \* \* \*